United States Patent
Park et al.

(10) Patent No.: US 11,950,439 B2
(45) Date of Patent: *Apr. 2, 2024

(54) WHITE ORGANIC LIGHT-EMITTING DEVICE AND DISPLAY DEVICE USING THE SAME

(71) Applicant: LG Display Co., Ltd., Seoul (KR)

(72) Inventors: Eun-Jung Park, Goyang-si (KR); Jung-Keun Kim, Seoul (KR); Wook Song, Seoul (KR); Tae-Shick Kim, Hwaseong-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/959,225

(22) Filed: Oct. 3, 2022

(65) Prior Publication Data

US 2023/0090815 A1 Mar. 23, 2023

Related U.S. Application Data

(63) Continuation of application No. 17/104,440, filed on Nov. 25, 2020, now Pat. No. 11,495,765.

(30) Foreign Application Priority Data

Dec. 6, 2019 (KR) .......................... 10-2019-0161895

(51) Int. Cl.
*H10K 50/13* (2023.01)
*H10K 50/11* (2023.01)
(Continued)

(52) U.S. Cl.
CPC .......... *H10K 50/131* (2023.02); *H10K 50/11* (2023.02); *H10K 50/15* (2023.02); *H10K 50/19* (2023.02);
(Continued)

(58) Field of Classification Search
CPC ...... H10K 50/131; H10K 50/11; H10K 50/15; H10K 50/19; H10K 59/38; H10K 59/12;
(Continued)

(56) References Cited

U.S. PATENT DOCUMENTS 8,558,224 B2 10/2013 Sawabe et al.
8,829,504 B2 9/2014 Song et al.
(Continued)

FOREIGN PATENT DOCUMENTS

CN 102694127 A 9/2012
CN 103022363 A 4/2013
(Continued)

OTHER PUBLICATIONS

China National Intellectual Property Administration, Office Action, Chinese Patent Application No. 202011382123.8, dated Sep. 1, 2023, 12 pages.
(Continued)

*Primary Examiner* — Mohammad A Rahman
(74) *Attorney, Agent, or Firm* — Fenwick & West LLP

(57) ABSTRACT

Disclosed herein are a white organic light-emitting device. The white organic light-emitting device enables an overall improvement in characteristics such as color temperature, efficiency, luminance, and service life, by changing the configuration of different types of emission layers in contact with each other, and a display device using the same.

20 Claims, 17 Drawing Sheets

(51) Int. Cl.
*H10K 50/15* (2023.01)
*H10K 50/19* (2023.01)
*H10K 59/12* (2023.01)
*H10K 59/38* (2023.01)
*H10K 85/30* (2023.01)
*H10K 101/00* (2023.01)
*H10K 101/10* (2023.01)
*H10K 101/30* (2023.01)
*H10K 101/40* (2023.01)

(52) U.S. Cl.
CPC .............. *H10K 59/38* (2023.02); *H10K 59/12* (2023.02); *H10K 85/342* (2023.02); *H10K 2101/10* (2023.02); *H10K 2101/27* (2023.02); *H10K 2101/30* (2023.02); *H10K 2101/40* (2023.02); *H10K 2101/90* (2023.02)

(58) Field of Classification Search
CPC ............. H10K 85/342; H10K 2101/10; H10K 2101/27; H10K 2101/30; H10K 2101/40; H10K 2101/90; H10K 50/13; H10K 50/12; H10K 59/00; H10K 50/14; H10K 2102/00; H01L 2251/5384
See application file for complete search history.

(56) References Cited

U.S. PATENT DOCUMENTS

| | | | |
|---|---|---|---|
| 10,003,038 | B2 | 6/2018 | Han et al. |
| 10,355,053 | B2 | 7/2019 | Jia et al. |
| 11,217,757 | B2 | 1/2022 | Adamovich et al. |
| 11,495,765 | B2* | 11/2022 | Park .................... H10K 50/131 |
| 11,700,766 | B2 | 7/2023 | Adamovich et al. |
| 2012/0241725 | A1 | 9/2012 | Sawabe et al. |
| 2013/0069073 | A1 | 3/2013 | Song et al. |
| 2013/0069077 | A1 | 3/2013 | Song et al. |
| 2017/0092888 | A1 | 3/2017 | Han et al. |
| 2018/0308905 | A1 | 10/2018 | Jia et al. |
| 2019/0280213 | A1 | 9/2019 | Adamovich et al. |
| 2020/0106040 | A1* | 4/2020 | Yamamoto ............. H10K 50/11 |
| 2022/0093876 | A1 | 3/2022 | Adamovich et al. |
| 2023/0320210 | A1 | 10/2023 | Adamovich et al. |

FOREIGN PATENT DOCUMENTS

| | | |
|---|---|---|
| CN | 106558652 A | 4/2017 |
| CN | 106898704 A | 6/2017 |
| KR | 10-2013-0031200 A | 3/2013 |
| KR | 10-2019-0024398 A | 3/2019 |
| KR | 10-2019-0107602 A | 9/2019 |

OTHER PUBLICATIONS

Korean Intellectual Property Office, Office Action, Korean Patent Application No. 10-2019-0161895, dated Jan. 2, 2024, 18 pages.

* cited by examiner

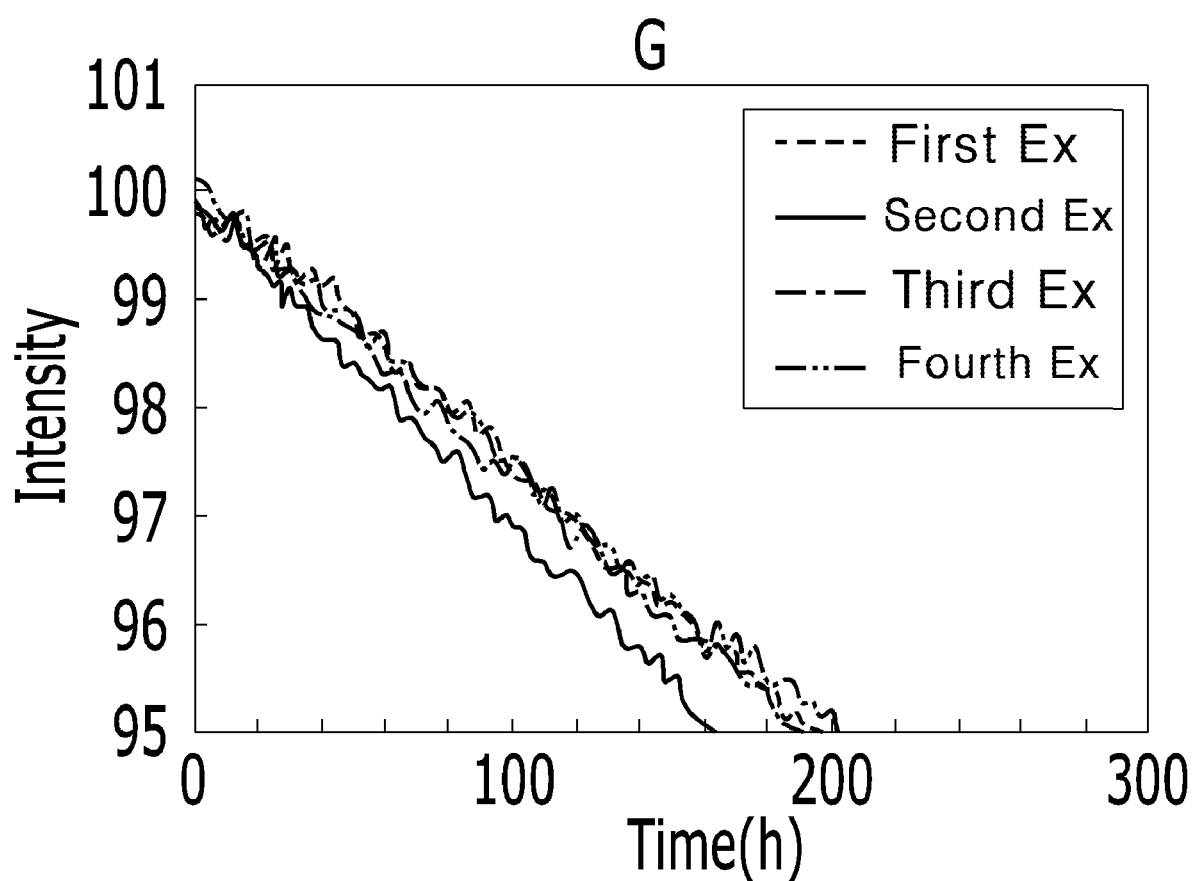

WHITE ORGANIC LIGHT-EMITTING DEVICE AND DISPLAY DEVICE USING THE SAME

CROSS-REFERENCE TO RELATED APPLICATIONS

This application is a continuation patent application of U.S. patent application Ser. No. 17/104,440, filed on Nov. 25, 2020, which claims the benefit of Republic of Korea Patent Application No. 10-2019-0161895, filed on Dec. 6, 2019, all of which are hereby incorporated by reference as if fully set forth herein.

BACKGROUND

Field

The present disclosure relates to a light-emitting device, and more particularly, to a white organic light-emitting device that enables an overall improvement in characteristics such as color temperature, efficiency, luminance, and service life, by changing the configuration of different types of emission layers in contact with each other, and a display device using the same.

Discussion of the Related Art

As the information age has fully arrived in recent years, the field of displays that visually display electrical signals containing information has rapidly developed. Accordingly, various flat display devices having excellent features, such as thinness, light weight, and low power consumption, have been developed, and have rapidly replaced existing cathode ray tubes (CRTs).

Specific examples of such flat display devices may include a liquid crystal display (LCD) device, a plasma display panel (PDP) device, a field emission display (FED) device, an organic light-emitting display (OLED) device, a quantum dot display device, and so on.

Among them, the organic light-emitting display device is considered a competitive application because it does not require a separate light source and enables realization of compact device design and vivid color display.

Meanwhile, the organic light-emitting display device includes a plurality of sub-pixels, and an organic light-emitting device provided in each of the sub-pixels to emit light without a separate light source.

In recent years, a tandem device constituting an organic layer and an emission layer in common without a deposition mask in the configuration of the organic light-emitting device is advantageous in terms of processability thereof, and has been studied.

However, in the tandem device having a plurality of emission layers, in particular, a stack having different types of emission layers may cause a change in the luminescent zone in the emission layers because the emission layers in the stack affect each other. The difficulty in adjusting the luminescent zone may lead to low efficiency, failure, short service life, and the like.

SUMMARY

Accordingly, the present disclosure is directed to a white organic light-emitting device and a display device using the same that substantially obviate one or more problems due to limitations and disadvantages of the related art.

An object of the present disclosure is to provide a white organic light-emitting device that enables an overall improvement in characteristics such as color temperature, efficiency, luminance, and service life, by changing the configuration of different types of emission layers in contact with each other, and a display device using the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a white organic light-emitting device of the present disclosure allows the configuration of different types of phosphorescent layers in a plurality of stacks to be changed so that the distribution of light emission occurs in a wider zone, including interfaces between the phosphorescent layers in the specific zone therein. Thus, carriers in each of the phosphorescent layers can be transferred without being trapped at each interface between the phosphorescent layers, resulting in a longer service life and increased efficiency. In addition, rich color display is possible due to the configuration of the different types of phosphorescent layers.

In accordance with an aspect of the present disclosure, there is provided a white organic light-emitting device that includes first and second electrodes facing each other, and a plurality of emission stacks, separated from each other by charge generation layers interposed therebetween, between the first electrode and the second electrode. At least one of the emission stacks may be a phosphorescent stack, and the phosphorescent stack may include a hole transport layer, and first to third phosphorescent layers sequentially provided on the hole transport layer to each emit light having a longer wavelength than blue light. The first phosphorescent layer may include a first red dopant having a lower HOMO energy level than the hole transport layer. The second phosphorescent layer may include a second red dopant having a HOMO energy level higher than the HOMO energy level of the first red dopant. The third phosphorescent layer may include a third dopant having a luminescence peak at a shorter wavelength than the first and second red dopants. Also, the third dopant has an electroluminescence peak at a shorter wavelength than the first and second dopants.

In accordance with another aspect of the present disclosure, there is provided a display device that includes a substrate having a thin film transistor in each of a plurality of sub-pixels, a first electrode connected to the thin film transistor in the sub-pixel, a second electrode spaced apart from the first electrode and provided across the sub-pixels, and a plurality of emission stacks, separated from each other by charge generation layers interposed therebetween, between the first electrode and the second electrode. At least one of the emission stacks may be a phosphorescent stack, and the phosphorescent stack may include a hole transport layer, and first to third phosphorescent layers sequentially provided on the hole transport layer to each emit light having a longer wavelength than blue light. The first phosphorescent layer may include a first red dopant having a HOMO energy level lower than or equal to that of the hole transport layer. The second phosphorescent layer may include a second red dopant having a HOMO energy level higher than the HOMO energy level of the first red dopant. The third phosphorescent layer may include a third dopant having a luminescence peak at a shorter wavelength than the first and second dopants. Also, the third dopant has an electroluminescence peak at a shorter wavelength than the first and second dopants.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

FIGS. 8A and 8B are graphs illustrating lifetimes of red and green emission layers in the first to fourth experimental examples.

DETAILED DESCRIPTION

Figure 1:
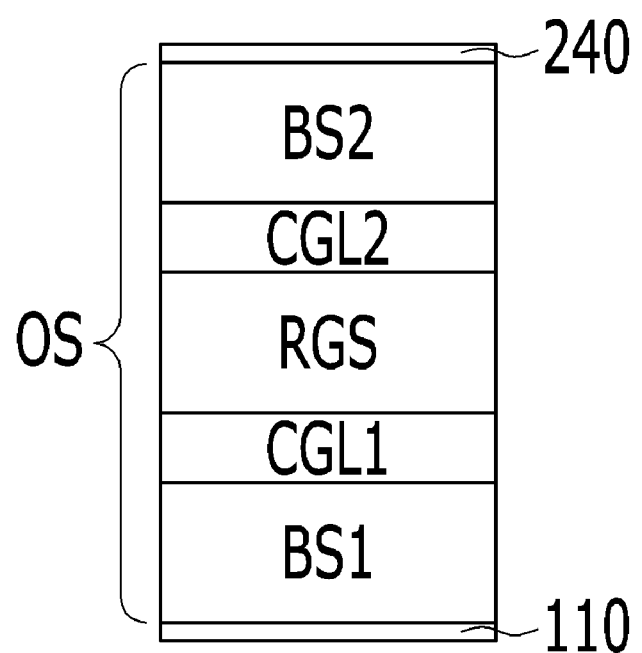
FIG. 1 is a cross-sectional view schematically illustrating a white organic light-emitting device according to a first embodiment of the present disclosure.

Reference will now be made in detail to the preferred embodiments of the present disclosure, examples of which are illustrated in the accompanying drawings. Wherever possible, the same reference numbers will be used throughout the drawings to refer to the same or like parts. In the following description, a detailed description of known functions and configurations incorporated herein will be omitted when the same may make the subject matter of the present disclosure rather unclear. The names of components used herein are selected in consideration of ease of preparation of the specification, and may be different from the names of parts of actual products.

In the drawings for explaining the various embodiments of the present disclosure, the illustrated shape, size, ratio, angle, and number are given by way of example, and thus are not limited to the disclosure of the present disclosure. Throughout the specification, the same reference numerals designate the same constituent elements. In the following description, a detailed description of known functions and configurations incorporated herein will be omitted when the same may make the subject matter of the present invention rather unclear. The terms "comprises," "includes," and/or "has" used herein do not preclude the presence or addition of other elements unless used along with the term "only". The singular forms "a," "an," and "the" are intended to include the plural forms as well, unless the context clearly indicates otherwise.

The components involved in the various embodiments of the present invention should be interpreted as including an error range even if there is no explicit description thereof.

In the various embodiments of the present disclosure, when describing positional relationships, for example, when the positional relationship between two parts is described using "on", "above", "below", "aside", or the like, one or more other parts may be located between the two parts, unless the term "directly" or "closely" is used.

In the various embodiments of the present disclosure, when describing temporal relationships, for example, when the temporal relationship between two actions is described using "after", "subsequently", "next", "before", or the like, the actions may not occur in succession unless the term "directly" or "just" is used.

In the various embodiments of the present disclosure, although terms such as, for example, "first" and "second" may be used to describe various elements, these terms are merely used to distinguish the same or similar elements from each other. Therefore, in the specification, an element modified by "first" may be the same as an element modified by "second" without exceeding the technical scope of the present invention unless otherwise mentioned.

The respective features of the various embodiments of the present disclosure may be partially or fully coupled to and combined with each other, and can be technically linked and driven in various manners. These embodiments may be performed independently of each other, or may be performed in association with each other.

In the specification, the "lowest unoccupied molecular orbital (LUMO) energy level" and "highest occupied molecular orbital (HOMO) energy level" of any layer refer to the LUMO energy level and HOMO energy level of the material that occupies the greatest weight percentage of the corresponding layer, for example, a host material, unless they are referred to as the LUMO energy level and HOMO energy level of the dopant material that is doped in the corresponding layer.

The term "HOMO energy level" used herein may be an energy level that is measured through cyclic voltammetry (CV), which determines an energy level from a potential value relative to a reference electrode with a known electrode potential value. For example, the HOMO energy level of any material may be measured by using, as the reference electrode, ferrocene, having known oxidation and reduction potential values.

The term "doped" used herein means that a material of any layer is added, in an amount of less than 10% by weight, to the material that occupies the greatest weight percentage of that layer, wherein the added material has physical properties (e.g., an N-type and a P-type, or an organic material and an inorganic material) different from the material accounting for the greatest weight percentage of that layer. In other words, the "doped" layer used herein refers to a layer in which a host material and dopant material of any layer are distinguishable from each other in consideration of the weight percentages thereof. In addition, the term "undoped" means all cases other than those indicated by the term "doped". For example, when any layer is made of a single material or a mixture of materials with the same or similar properties, the layer is an "undoped" layer. For example, when at least one of the constituent materials of any layer is of a P-type while the other materials of the layer are not of an N-type, the layer is an "undoped" layer. For example, when at least one of the constituent materials of any layer is an organic material while the other materials of the layer are not inorganic materials, the layer is an "undoped" layer. For example, in the case where all constituent materials of any layer are organic materials while at least one of the constituent materials is of an N-type and at least one constituent material is of a P-type, when the weight percent of the N-type material is less than 20% or the weight percent of the P-type material is less than 20%, the layer is a "doped" layer.

The electroluminescence (EL) spectrum used herein is calculated by multiplying (1) a photoluminescence (PL) spectrum, which reflects the inherent characteristics of a luminescent material, such as a dopant material or a host material, included in an organic emission layer, by (2) an outcoupling/emittance spectrum curve which is determined according to the structure and optical characteristics of an organic light-emitting device, including the thicknesses of organic layers such as an electron transport layer.

A white organic light-emitting device according to the present disclosure is an optical device that includes a plurality of emission stacks, stacked between a first electrode and a second electrode to realize white light by combining the colors of light emitted from the respective emission stacks. Accordingly, although the white organic light-emitting device includes the emission stacks, which are provided between the first electrode and the second electrode, to emit different colors of light, it may further include stacks that emit the same color of light as necessary.

The white organic light-emitting device according to the present disclosure is characterized in particular by including a phosphorescent stack formed of a plurality of different types of emission layers in contact with each other. Through such a configuration, the white organic light-emitting device of the present invention can obtain overall improvements, for example, high color temperature, rich color display, high efficiency, and increased service life.

Figure 2A:
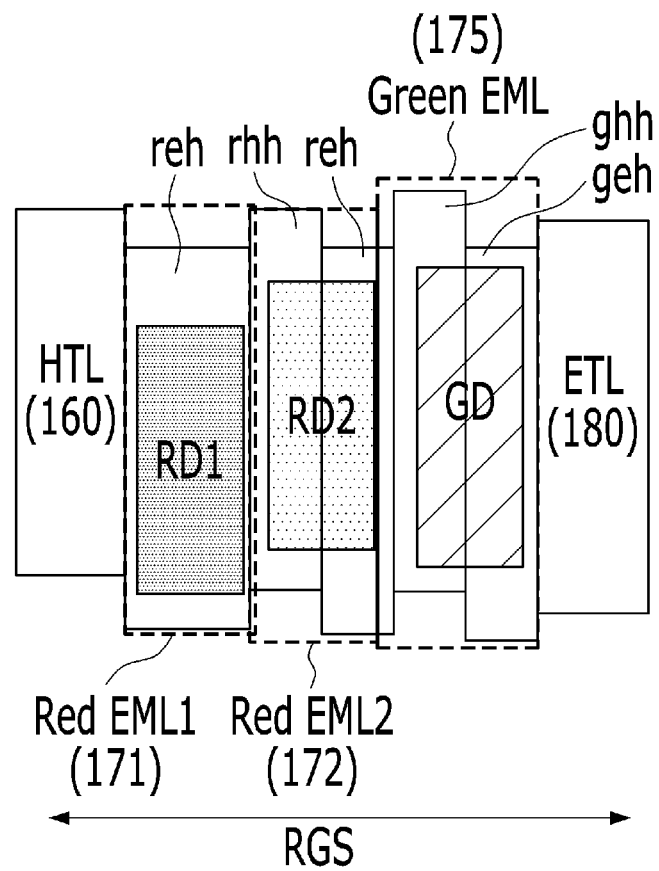
FIG. 2A is an energy band diagram between a hole transport layer, phosphorescent layers, and an electron transport layer of the phosphorescent stack of FIG. 1 according to an embodiment of the present disclosure.

FIG. 1 is a cross-sectional view schematically illustrating a white organic light-emitting device according to a first embodiment of the present disclosure. FIG. 2A is an energy band diagram between a hole transport layer and a red emission layer of the phosphorescent stack of FIG. 1.

As illustrated in FIG. 1, the white organic light-emitting device according to the first embodiment of the present disclosure includes first and second electrodes 110 and 240 facing each other, and an organic stack OS between the first electrode 110 and the second electrode 240. Each layer of the organic stack contains an organic material as a main component, and may contain, if necessary, a metal or a nonmetallic inorganic material, such as halogen, nitrogen, or sulfur, to improve the transport of carriers or luminescence properties. The organic stack of the present disclosure includes a plurality of emission stacks BS1, RGS, and BS2 separated from each other by charge generation layers CGL1 and CGL2 interposed therebetween. At least one of the emission stacks is a phosphorescent stack RGS.

As illustrated in FIG. 1, the white organic light-emitting device may include a plurality of blue emission stacks BS1 and BS2 to compensate for the luminous efficiency of blue light, which is insufficient compared to that of other colors of light. This is because a blue emissive material known to date has luminous efficiency lower than emissive materials of other colors. Accordingly, if the blue emissive material, which has luminous efficiency equal to or greater than that of the emissive materials of other colors, is developed, a single blue emission stack may also be provided between the first and second electrodes.

The blue light from the blue emission stacks BS1 and BS2 and the green and red light from the phosphorescent stack RGS are combined and radiated on either of the first electrode 110 and/or the second electrode 240, thereby finally realizing white light.

The blue emission stacks BS1 and BS2 have a luminescence peak at a wavelength of 440 nm to 480 nm, and the phosphorescent stack RGS has a luminescence peak at a longer wavelength than the above wavelength. For example, the phosphorescent stack RGS includes different types of emission layers that emit different colors of light, and has luminescence peaks at different green and red wavelengths. Due to the luminescence properties of the green dopant used for the green emission layer of the phosphorescent stack, the green wavelength may range from 500 nm to 540 nm, at which the green emission layer has a luminescence peak to emit pure green light, or may range from 540 nm to 580 nm, at which the green emission layer has a luminescence peak corresponding to emission of near yellow-green light. Alternatively, the different types of emission layers included in the phosphorescent stack RGS may consist of a red emission layer, a yellow-green emission layer, and a green emission layer in sequence. Here, the red emission layer has a luminescence peak at a wavelength of 600 nm to 640 nm.

In addition, if the emission of more blue light than other colors of light is further required when the white organic light-emitting device is used for a display device, three or more blue emission stacks may be provided between the first electrode and the second electrode.

Meanwhile, one of the first and second electrodes 110 and 240 may be used as a reflective electrode while the other may be used as a transparent electrode, or both may be used as transparent electrodes. When one of the first and second electrodes 110 and 240 is the reflective electrode, light may be radiated on the other transparent electrode. On the other hand, when both the first and second electrodes 110 and 240 are the transparent electrodes, the display device including the white organic light-emitting device may be used as a transparent display device.

The transparent electrode(s) used as the first electrode 110 and/or the second electrode 240 may be made of, for example, one of indium tin oxide (ITO), indium zinc oxide (IZO), and indium tin zinc oxide (ITZO). The reflective electrode may be made of one of APC (Ag:Pb:Cu), Ag, Al, and Mg, or may be an alloy layer containing one thereof, or may be composed of non-reflective metal, including layers made of the listed materials, which is stacked therewith.

Figure 2B:
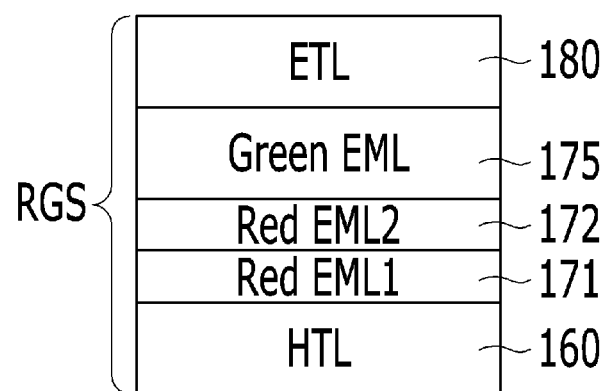
FIG. 2B is a cross-sectional view of FIG. 2A according to an embodiment of the present disclosure.

As illustrated in FIGS. 2A and 2B, the phosphorescent stack RGS includes a hole transport layer 160, and a phosphorescent unit PS that includes first to third phosphorescent layers 171, 172, and 175 sequentially disposed on the hole transport layer 160 to each emit light having a longer wavelength than blue light. An electron transport layer 180 is formed on the phosphorescent unit PS.

The first phosphorescent layer 171 in contact with the hole transport layer 160 includes a first dopant RD1 having a HOMO energy level lower than or equal to the HOMO energy level of the hole transport layer 160. The first dopant RD1 allows holes to be transferred from the hole transport layer 160 to the phosphorescent unit without being trapped at an interface with the first phosphorescent layer 171.

The first and second phosphorescent layers 171 and 172 are emission layers that emit the same color or similar colors of light. The third phosphorescent layer 175 has a difference in luminescence peak, within a shorter wavelength of approximately 60 nm to 120 nm, from the first and second phosphorescent layers 171 and 172. The difference in luminescence peak between the first and second phosphorescent layers 171 and 172 is within a wavelength of about 40 nm, and the first and second phosphorescent layers 171 and 172, which are in contact with each other, emit the same color or similar colors of light and are involved in efficiency of emission of the same color of light.

For example, when the first and second phosphorescent layers 171 and 172 are red emission layers, the third phosphorescent layer 175 may be a yellow-green emission layer or a green emission layer. The first and second phosphorescent layers 171 and 172 may have a luminescence peak at a wavelength of approximately 600 nm to 640 nm, and the third phosphorescent layer 175 may have a luminescence peak at a wavelength of 500 nm to 540 nm or a luminescence peak at a wavelength of 540 nm to 580 nm.

Since the luminance required for securing the luminous efficiency of the white organic light-emitting device depends mainly on green light, the third phosphorescent layer 175 for emitting green light may be relatively thicker than the total of the first and second phosphorescent layers 171 and 172 for emitting red light. The third phosphorescent layer 175 may have a thickness of about 250 to 450 Å, and the first and second phosphorescent layers 171 and 172 may have a total thickness of about 150 to 200 Å.

In the structure of the phosphorescent stack RGS, the first to third phosphorescent layers 171, 172, and 175 are in the same stack, holes are supplied from the hole transport layer 160, and electrons are supplied from the electron transport layer 180. Therefore, it is important to transfer carriers between the first to third phosphorescent layers 171, 172, and 175, in order to prevent the generation of excitons concentrated on a certain emission layer or certain zone in the phosphorescent unit PS for uniform emission of light from the first to third phosphorescent layers 171, 172, and 175.

In particular, the first phosphorescent layer 171 is in contact with the hole transport layer 160 and serves as a boundary for holes to enter the phosphorescent unit PS. Therefore, a hole transfer function is important not only for light emission from the first phosphorescent layer 171 but also for sufficient light emission from the second and third phosphorescent layers 172 and 175 subsequent thereto. The first phosphorescent layer 171 of the present disclosure includes a first dopant RD1 having a HOMO energy level lower than or equal to the HOMO energy level of the hole transport layer 160. Thus, due to the low HOMO characteristics of the first dopant RD1, holes may be transferred to the adjacent second and third phosphorescent layers 172 and 175 without being trapped at the interface between the hole transport layer 160 and the first phosphorescent layers 171. If the HOMO energy level of the dopant of the phosphorescent layer in contact with the hole transport layer 160 is higher than that of the hole transport layer, holes may be accumulated due to the high HOMO energy level of the dopant.

In this case, the first dopant RD1 itself has a high hole mobility. Accordingly, even if the first dopant RD1 includes only an electron transport host as the host of the first phosphorescent layer 171, the first dopant RD1 allows holes to be easily supplied to the second and third phosphorescent layers 172 and 175 without being trapped, with the hole mobility maintained in the first dopant RD1.

In addition, when there is no trap in the organic stack, holes generally move faster than electrons, so the first dopant RD1 includes only the electron transport host, in order to maintain the flow of holes, which are not accumulated in the phosphorescent unit PS, by the first dopant RD1 having a low HOMO energy level in the first phosphorescent layer 171, and simultaneously to recombine the holes with the electrons transferred from the electron transport layer 180 via the third and second phosphorescent layers 175 and 172 to the first phosphorescent layer 171 in a balanced manner. Accordingly, some of the electrons transferred to the phosphorescent unit are also limited to the first phosphorescent layer 171 to balance and recombine holes and electrons in the first phosphorescent layer 171, thereby enabling the first phosphorescent layer 171 to also emit light.

In the phosphorescent unit PS, although the respective second and third phosphorescent layers 172 and 175 primarily emit red and green light, light is also emitted from the interface between the second and third phosphorescent layers 172 and 175. Furthermore, both the first and second phosphorescent layers 171 and 172 emit red light, and differ only in terms of their luminescence intensities. In other words, the red light from the first and second phosphorescent layers 171 and 172 is emitted in a form that the intensity thereof gradually decreases from the interface between the second and third phosphorescent layers 172 and 175 toward the second phosphorescent layer 172 and the first phosphorescent layer 171. Here, the first and second phosphorescent layers 171 and 172 emit the same color or similar colors of light. In addition, the overall thickness of the first and second phosphorescent layers 171 and 172 is smaller than that of the third phosphorescent layer 175, and the intensity of light gradually decreases in the order of the second and first phosphorescent layers 172 and 171. Thus, there is little difference in the optical interface between the second and first phosphorescent layers 172 and 171. Moreover, since the first and second phosphorescent layers 171 and 172 include electron transport hosts reh made of the same material, there is no barrier to interlayer electron movement.

The third phosphorescent layer 175 emits green light from the interface with the second phosphorescent layer 172 to above the center of the third phosphorescent layer 175 in the thickness direction thereof.

The second and third phosphorescent layers 172 and 175 include a hole transport host and an electron transport host, respectively, to prevent the concentration of excitons on one of the second and third phosphorescent layers 172 and 175 and to uniformly adjust the mobility of holes and electrons for uniform distribution of excitons in each emission layer.

However, when no holes accumulate in the first phosphorescent layer 171, holes may be rapidly transferred in the second phosphorescent layer 172. Therefore, it is preferable that the second phosphorescent layer 172 have the electron transport host reh in a larger amount than the hole transport host rhh so as to move electrons by more than a certain amount. It is preferable that the third phosphorescent layer 175 adjust the hole transport host ghh to be included in an amount equal to or larger than the electron transport host in order to facilitate the supply of holes relatively far from the hole transport layer 160 in the phosphorescent unit PS.

The electron transport hosts reh included in the first and second phosphorescent layers 171 and 172 may be made of the same material such that there is no interface barrier to electron transfer. It is preferable in terms of electron supply for the electron transport hosts reh of the first and second phosphorescent layers 171 and 172 and the electron transport host geh of the third phosphorescent layer 175 to have a lower LUMO energy level than the electron transport layer 180.

The first and second dopants RD1 and RD2 of the respective first and second phosphorescent layers 171 and 172 are each included in an amount of 2 wt % to 9 wt %. Since the first dopant RD1 functions to prevent a hole trap in addition to light emission in the first phosphorescent layer 171, the first dopant RD1 may be preferably included in a larger amount than the second dopant RD2 of the second phosphorescent layer 172. In the second phosphorescent layer 172, the amount of the hole transport host rhh is less than that of the electron transport host reh. In the second phosphorescent layer 172, the ratio of the hole transport host to the electron transport host (rhh:reh) is preferably 4:6 to 2:8 in order to balance holes and electrons in the first to third phosphorescent layers 171, 172, and 175.

The amount of the third dopant GD in the third phosphorescent layer 175 may be 5 wt % to 19 wt %, more preferably 5 wt % to 15 wt %. The ratio of the hole transport host to the electron transport host (ghh:geh) in the third phosphorescent layer 175 may be 5:5 to 7:3 so that the supply rate of holes in the third phosphorescent layer 175 far from the hole transport layer 160 is similar to the supply rate of electrons entering directly from the electron transport layer 180.

In the phosphorescent stack of the white organic light-emitting device of the present disclosure, light emission is not concentrated only at the interlayer interface thereof, and even distribution of light emission occurs in each phosphorescent layer. Therefore, it is possible to prevent interface deterioration, achieve increased efficiency, and prevent a decrease in service life.

For example, if the red emission layer and the green emission layer are each provided adjacent to each other as a single emission layer, a large number of excitons are distributed at the interface between the red emission layer and the green emission layer. In this case, at the interface, the excitons are accumulated or the carriers such as holes and/or electrons are accumulated, resulting in interface deterioration and thus a decrease in service life. In severe cases, some holes or electrons that are not used for recombination may be moved beyond the phosphorescent unit to the electron transport layer or the hole transport layer, resulting in a further decrease in service life and a reduction in efficiency due to the carriers being passed. The present disclosure can solve these issues by providing the first phosphorescent layer and adjusting the ratio of the hosts in the second and third phosphorescent layers.

The white organic light-emitting device of the present disclosure can be manufactured to have high efficiency and long service life by increasing or maximizing the efficiency of the phosphorescent stack and distributing the carriers concentrated at each interlayer interface.

In the above description, the first dopant RD1 is, for example, in the form of thieno-pyrimidine combined with iridium, as illustrated in the following Formula 1, and affects the phenyl group due to the strong electron acceptor property of the thieno-pyrimidine, so that the HOMO energy level in the red dopant RD1 is lowered. Thus, the holes transferred from the hole transport layer 160 adjacent to the first phosphorescent layer 171 may pass through the first phosphorescent layer 171 without being trapped at the HOMO energy level of the first dopant RD1.

[Formula 1]

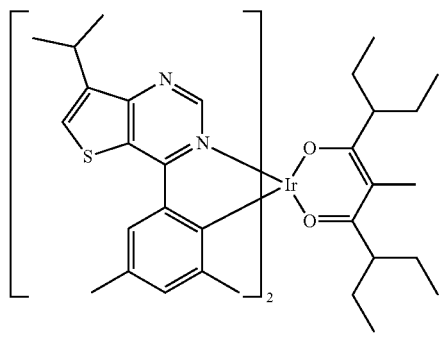

The thieno-pyrimidine presented as the first red dopant is not limited to the compound combined with iridium. Besides, the thieno-pyrimidine may be replaced with any compound having a lower HOMO energy level than the adjacent hole transport layer.

The second dopant RD2 is, for example, a compound of heavy metal, such as iridium (Ir), and triphenylamine, as illustrated in the following Formula 2 or 3, and has a higher HOMO energy level of approximately 0.1 eV to 0.3 eV than the HOMO energy level of the hole transport layer 160. Here, whether the HOMO energy level is high or low is determined based on the up-and-down relationship in the energy band diagram. The HOMO energy level and LUMO energy level in the energy band diagram have increasingly negative values based on a virtual vacuum level Evac. When comparing absolute values, the absolute value of the HOMO energy level of the second dopant RD2 is smaller than that of the HOMO energy level of the hole transport layer 160.

[Formula 2]

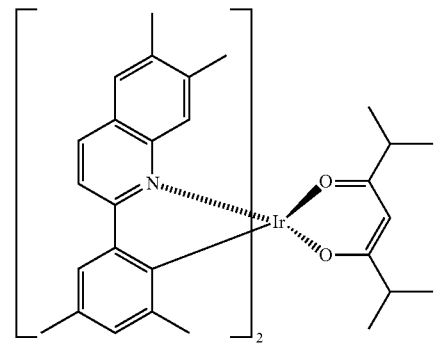

-continued

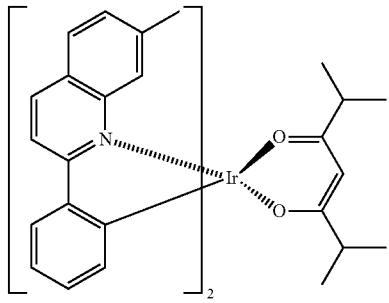

[Formula 3]

The electron transport host used for each of the first to third phosphorescent layers 171, 172, and 175 is, for example, a compound having a triazine core, and the hole transport host used therefore is a phenylamine compound or a biphenylamine compound. Here, the electron transport hosts of the first and second phosphorescent layers 171 and 172 may be the same, and the electron transport host geh of the third phosphorescent layer 175 may be the same as or different from the electron transport hosts of the first and second phosphorescent layers 171 and 172. If different, the electron transport host geh of the third phosphorescent layer 175 may have a different HOMO energy level characteristic and/or a LUMO energy level characteristic since the triazine core compound of the third phosphorescent layer 175 and the electron transport hosts reh of the first and second phosphorescent layers 171 and 172 have different substituents. In addition, the hole transport hosts rhh and ghh of the second and third phosphorescent layers 172 and 175 may be the same as or different from each other. If different, the hole transport hosts rhh and ghh of the second and third phosphorescent layers 172 and 175 may have different HOMO energy level characteristics and/or LUMO energy level characteristics since the phenylamine compounds or biphenylamine compounds thereof have different substituents.

Hereinafter, whether a hole trap occurs due to the phosphorescent dopant characteristics of the phosphorescent layer in contact with the hole transport layer will be described.

Figure 3A:
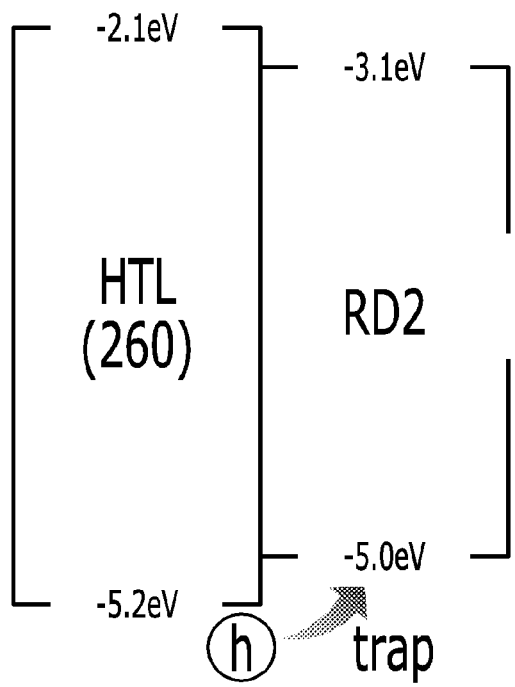
FIGS. 3A and 3B are diagrams illustrating whether a hole trap occurs, due to HOMO level characteristics of a phosphorescent dopant, between a hole transport layer and a phosphorescent layer adjacent to each other.
Figure 3B:
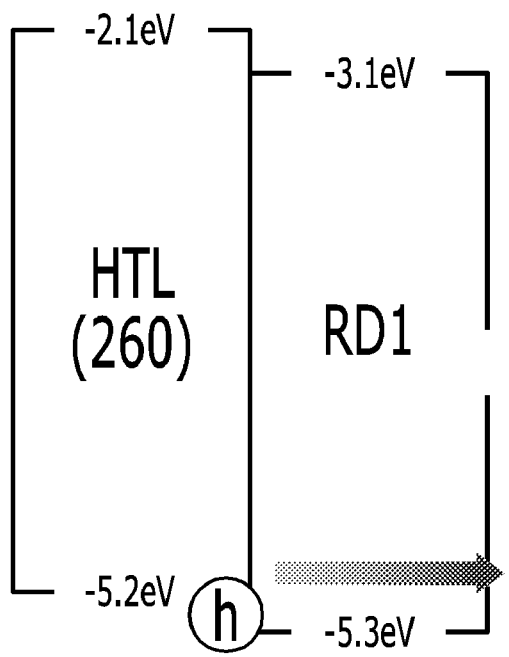

FIGS. 3A and 3B are diagrams illustrating whether a hole trap occurs, due to the HOMO energy level characteristics of the phosphorescent dopant, between the hole transport layer and the phosphorescent layer adjacent to each other.

The phosphorescent dopants used in FIGS. 3A and 3B are the second dopant RD2 and the first dopant RD1, respectively, used for the second and first phosphorescent layers, respectively, of the white organic light-emitting device of the present disclosure.

As illustrated in FIG. 3A, for example, when the hole transport layer 260 and the second dopant RD2 are adjacent to each other, the HOMO energy level of the second dopant RD2 is higher than that of the hole transport layer 260. Hence, if holes h are transferred near the HOMO energy level, the holes may be trapped at the HOMO energy level of the second dopant RD2.

On the other hand, as illustrated in FIG. 3B, when the hole transport layer 260 and the first dopant RD1 are adjacent to each other, the HOMO energy level of the first dopant RD1 is lower than that of the hole transport layer 260. Therefore, holes h transferred near the HOMO energy level pass to an adjacent phosphorescent layer without being trapped.

Hereinafter, the white organic light-emitting device of the present disclosure described with reference to FIG. 1 will be described with reference to FIG. 4. The structure illustrated in FIG. 4 is also used in fourth and eighth experimental examples to be described later.

Figure 4:
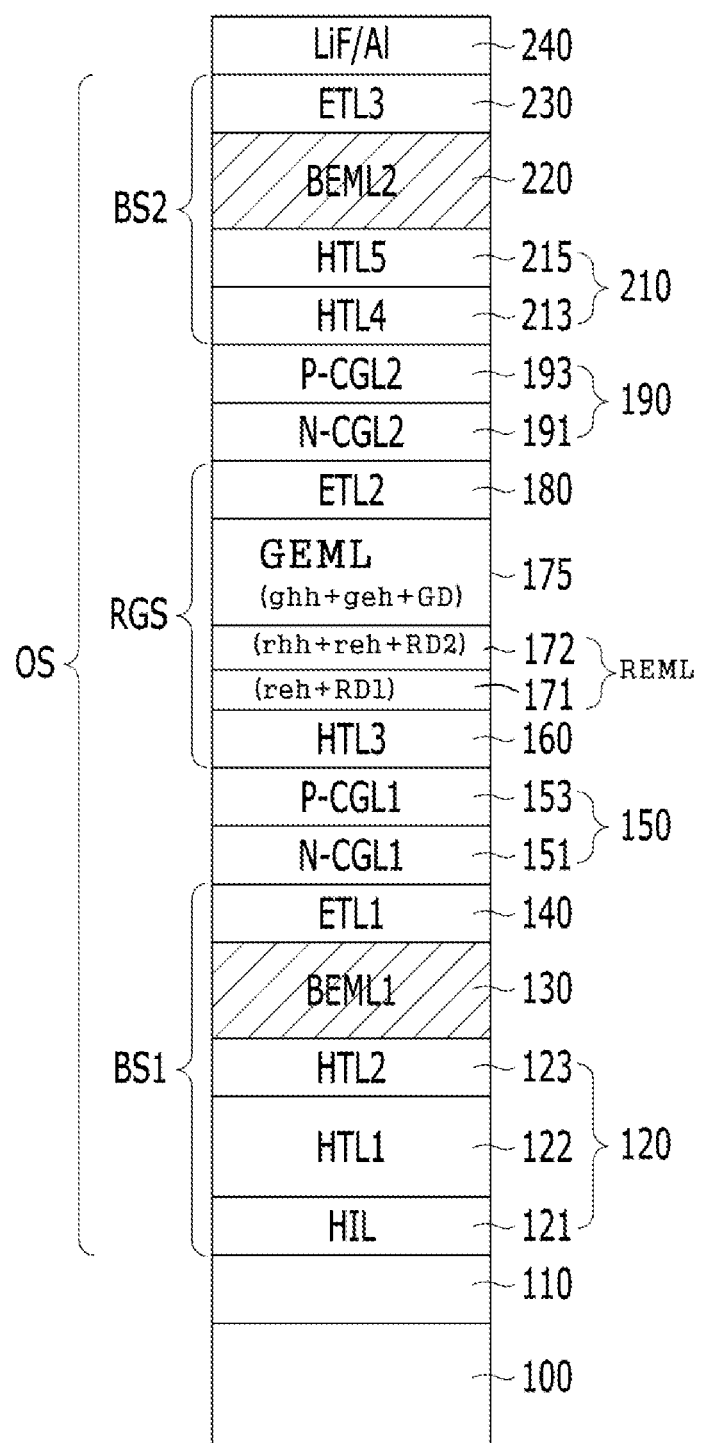
FIG. 4 is a cross-sectional view illustrating the white organic light-emitting device according to the embodiment of the present disclosure.

FIG. 4 is a cross-sectional view illustrating the white organic light-emitting device according to the embodiment of the present disclosure.

As illustrated in FIG. 4, the white organic light-emitting device of the present disclosure includes first and second electrodes 110 and 240, facing each other on a substrate 100, with an organic stack OS provided between the first electrode 110 and the second electrode 240.

The organic stack OS includes a plurality of emission stacks BS1, RGS, and BS2 and charge generation layers 150 and 190 between the emission stacks.

The light from the respective emission stacks BS1, RGS, and BS2 provided in the organic stack OS are combined and radiated on either of the first electrode 110 and/or the second electrode 240, thereby realizing white light. When the first electrode 110 is used as a reflective electrode and the second electrode 240 is used as a transparent electrode, light is radiated on the second electrode 240. On the other hand, when the first electrode 110 is used as a transparent electrode and the second electrode 240 is used as a reflective electrode, light is radiated on the first electrode 110. In some cases, when both the first and second electrodes 110 and 240 are transparent electrodes, light may pass in both directions.

Although the example of FIG. 4 illustrates that the emission stacks consist of a first blue emission stack BS1, a phosphorescent stack RGS, and a second blue emission stack BS2 provided in that order from the first electrode 110 to the second electrode 240, the above order may be changed. In order to realize white light, only two stacks, namely the blue emission stack and the phosphorescent stack, may be provided between the first and second electrodes 110 and 240. In some cases, four or more emission stacks may be provided. A color coordinate value may be changed corresponding to the color temperature for white display of the white organic light-emitting device to be implemented by varying the number of emission stacks according to the required color temperature. Under the same condition of emission stack, the color temperature may increase as the number of emission stacks increases.

Meanwhile, when three or more emission stacks are provided between the first and second electrodes 110 and 240, two or more blue emission stacks BS may be provided.

The blue emission stacks BS1 and BS2 have a luminescence peak at a wavelength of 440 nm to 480 nm, and the phosphorescent stack RGS has a luminescence peak at a longer wavelength than the above wavelength. The phosphorescent stack RGS includes different types of emission layers of the phosphorescent unit PS of FIGS. 2A and 2B, thereby having luminescence peaks at different green and red wavelengths. The red wavelength ranges from 600 nm to 640 nm, at which the phosphorescent stack RGS has a luminescence peak, and occurs in the first and second phosphorescent layers 171 and 172 that emit the same color or similar colors of light. Due to the luminescence properties of the green dopant used for the third phosphorescent layer 175, the green wavelength ranges from 500 nm to 540 nm at which the third phosphorescent layer 175 may have a luminescence peak corresponding to emission of pure green light. Alternatively, the third phosphorescent layer 175 may have a luminescence peak at a yellow-green wavelength ranging from 540 nm to 580 nm, instead of the green wavelength, which may be implemented using a yellow-green dopant.

The first and second phosphorescent layers 171 and 172 are emission layers that emit the same color or similar colors of light. The first and second phosphorescent layers 171 and 172 may have the same luminescence peak or different luminescence peaks whose difference is within a wavelength of 40 nm or less, to emit the same color or similar colors of light. The colors of light from the first and second phosphorescent layers 171 and 172 are determined by the first and second dopants RD1 and RD2 that emit the same color or similar colors of light. The first and second dopants RD1 and RD2 have different HOMO energy levels such that the HOMO energy level of the first dopant RD1 is low and the HOMO energy level of the second dopant RD2 is high on the basis of the HOMO energy level of the hole transport layer 160.

The blue light from the blue emission stacks BS1 and BS2 and the green or yellow-green light and the red light from the phosphorescent stack RGS are combined and radiated on either of the first electrode 110 and/or the second electrode 240, thereby finally realizing white light.

Each of the emission stacks BS1, RGS, and BS2 includes a hole transport unit 120, 160, or 210, an emission layer 130, 173/175, or 220, and an electron transport unit 140, 180, or 230, respectively.

In FIG. 4, the hole transport unit 120 of the first blue emission stack BS1 includes a hole injection layer 121, a first hole transport layer 122, and a second hole transport layer 123.

The hole injection layer 121 is a layer that is in direct contact with the first electrode 110 as an inorganic component of the transparent electrode or reflective electrode of the organic stack OS. The hole injection layer 121 is a layer that lowers interfacial stress and energy barriers when holes enters the interface with the first electrode 110, thereby allowing the holes to be smoothly injected into the organic stack OS. If another emission unit such as the phosphorescent unit is in contact with the first electrode 110, a hole injection layer may be provided in the phosphorescent unit. Here, the first electrode 110 functions as an anode.

The reason why the first and second hole transport layers 122 and 123 are included in the hole transport unit 120 of the first blue emission stack BS1 is to create a first appropriate blue optical distance from the first electrode 110. This enables optimal resonance for repeated reflection and re-reflection to be generated within the distance between the first electrode 110 and the second electrode 240, which may be changed by the position of the reflective electrode, used as one of the first and second electrodes 110 and 240, the thickness of the transparent electrode, used as one of the first and second electrodes 110 and 240, and the like. In the provided hole transport unit 120, the first and second hole transport layers 122 and 123 may be changed in thickness or either one thereof may be removed.

In addition, the first blue emission stack BS1 includes a first blue emission layer 130 and a first electron transport layer 140 on the hole transport unit 120.

The first blue emission layer 130 provided in the first blue emission stack BS1 includes a host and a blue dopant that emits light by receiving the energy of excitons generated by the host. The blue dopant may be a phosphorescent dopant or a fluorescent dopant, or may include both. In the following experimental examples, the first and second blue emission layers 130 and 220 of the first and second blue emission stacks BS1 and BS2, respectively, which are used when determining white color coordinates were tested with blue fluorescent dopants. This is because, among blue-based dopants developed to date, a blue fluorescent dopant has been verified to have lifetime and efficiency above a certain level. If there is a blue phosphorescent dopant having lifetime and efficiency equal or identical to those of the blue fluorescent dopant, the fluorescent dopant may be replaced therewith. In the white organic light-emitting device of the present disclosure, the blue emission stack is provided separately from the phosphorescent stack to emit light having a longer wavelength than blue light, in order for the blue emission stack to sufficiently realize a blue color, in the case where the display device requires uniform color display, because the blue color is visually perceived at a lower level than other colors.

The phosphorescent stack RGS located on the first blue emission stack BS1 includes different types of phosphorescent layers. The phosphorescent stack RGS includes a third hole transport layer 160, a first phosphorescent layer 171, a second phosphorescent layer 172, a third phosphorescent layer 175, and a second electron transport layer 180.

In the phosphorescent stack RGS, the first and second phosphorescent layers 171 and 172 emit similar red light, and the third phosphorescent layer 175 emits approximately green or yellow-green light having a shorter wavelength than the light emitted from the first and second phosphorescent layers 171 and 172.

As described above, the first phosphorescent layer 171 includes only an electron transport host Reh and a first dopant RD1, and has a property in which the HOMO energy level of the first dopant RD1 is lower than that of the hole transport layer 160 to prevent holes from being trapped at the interface with the hole transport layer 160. That is, only the electron transport host Reh may be used as a host in the first phosphorescent layer 171.

In order for the second and third phosphorescent layers 172 and 175 to prevent interface deterioration and to exhibit even distribution of light emission, the second phosphorescent layer 172 includes a hole transport host and an electron transport host at a ratio of 4:6 to 2:8, and the third phosphorescent layer 175 includes a hole transport host and an electron transport host at a ratio of 5:5 to 7:3. The respective second and third phosphorescent layers 172 and 175 include a red dopant and a green dopant.

The third phosphorescent layer 175 is in contact with the second electron transport layer.

To this end, the white organic light-emitting device of the present disclosure proposes the configuration of the first to third phosphorescent layers 171, 172, and 175. As illustrated in FIGS. 2A and 2B, the first phosphorescent layer 171 includes only the first dopant RD1 and electron transport host reh having a HOMO energy level lower than the HOMO energy level of the adjacent third hole transport layer 160. The difference in HOMO energy level between the third hole transport layer 160 and the first dopant RD1 (ΔHOMO) is approximately 0.01 eV to 0.5 eV. It is preferable, in terms of hole transport, for the HOMO energy level of the first dopant RD1 to be positioned above that of the electron transport host reh.

That is, in the phosphorescent stack RGS including the different types of emission layers 171, 172, and 175, the first phosphorescent layer 171 in contact with the third hole transport layer 160 includes the first dopant RD1 having the HOMO energy level lower than the HOMO energy level of the hole transport layer 160. Thus, carriers, in particular, holes from the adjacent third hole transport layer 160 may pass to the red dopant RD1 in the zone of the first phosphorescent layer 171 adjacent to the third hole transport layer 160 without being trapped, and may be smoothly transferred to the rear second and third phosphorescent layers 172 and 175 through the first phosphorescent layer 171.

In the phosphorescent stack RGS, the first phosphorescent layer 171 includes only the electron transport host reh, and the second and third phosphorescent layers 172 and 175 include the hole transport hosts rhh and ghh, respectively, and the electron transport hosts reh and geh, respectively. The holes passed from the third hole transport layer 160 are not accumulated in the red emission layer 173 and are maintained by a constant transfer rate. Particular, in order to prevent a phenomenon in which the holes at a low gray scale value (low current density) are transferred to the rear of the different types of emission layers, that is, far from the first electrode 110, resulting in variation in a luminescent zone, due to the difference in electric field dependence between holes and electrons, and to balance emission of light from the plurality of first to third phosphorescent layers 171, 172, and 175, the first phosphorescent layer 171 includes only the electron transport host. As a result, the luminescent zone may be generated around the boundary between the second phosphorescent layer 172 and the third phosphorescent layer 175.

The second blue emission stack BS2 includes a hole transport unit 210 in which fourth and fifth hole transport layers 213 and 215 are stacked, a second blue emission layer 220, and a third electron transport layer 230.

As illustrated in FIG. 1, the second electrode 240 contains LiF and Al as inorganic compound components. The LiF component functions as an electron injection layer, and the Al component substantially functions as the second electrode, serving as a cathode.

The electron injection layer is made of a compound of alkali metal or alkaline earth metal and halogen, and the material thereof may be changed to a material other than the LiF. Alternatively, there may be no electron injection layer in some cases.

In addition, the Al presented as the second electrode 240 is merely an example, and may be changed to another metal that facilitates electron injection. In some cases, the second electrode 240 may be formed by stacking a plurality of metal layers, among which one is made of reflective metal while the others are made of transparent metal.

Meanwhile, each of the charge generation layers 150 and 190 may be formed by stacking an N-type charge generation layer 151 or 191, which is in contact with the lower emission stack adjacent thereto, and a P-type charge generation layer 153 or 193, which is in contact with the upper emission stack adjacent thereto, respectively, as illustrated in the drawing. However, this configuration is merely an example, and a charge generation layer may also be provided in which at least one host includes an N-type dopant and a P-type dopant to generate holes and electros supplied to an adjacent stack.

Although the example of FIG. 1 illustrates that the first and second blue emission stacks BS1 and BS2 are located, respectively, beneath and above the phosphorescent stack RGS, the present disclosure is not limited thereto. The positions of the first and second blue emission stacks BS1 and BS2 may be changed if necessary.

Hereinafter, various experimental examples will be described to verify the effect of the white organic light-emitting device of the present disclosure.

Figure 5A:
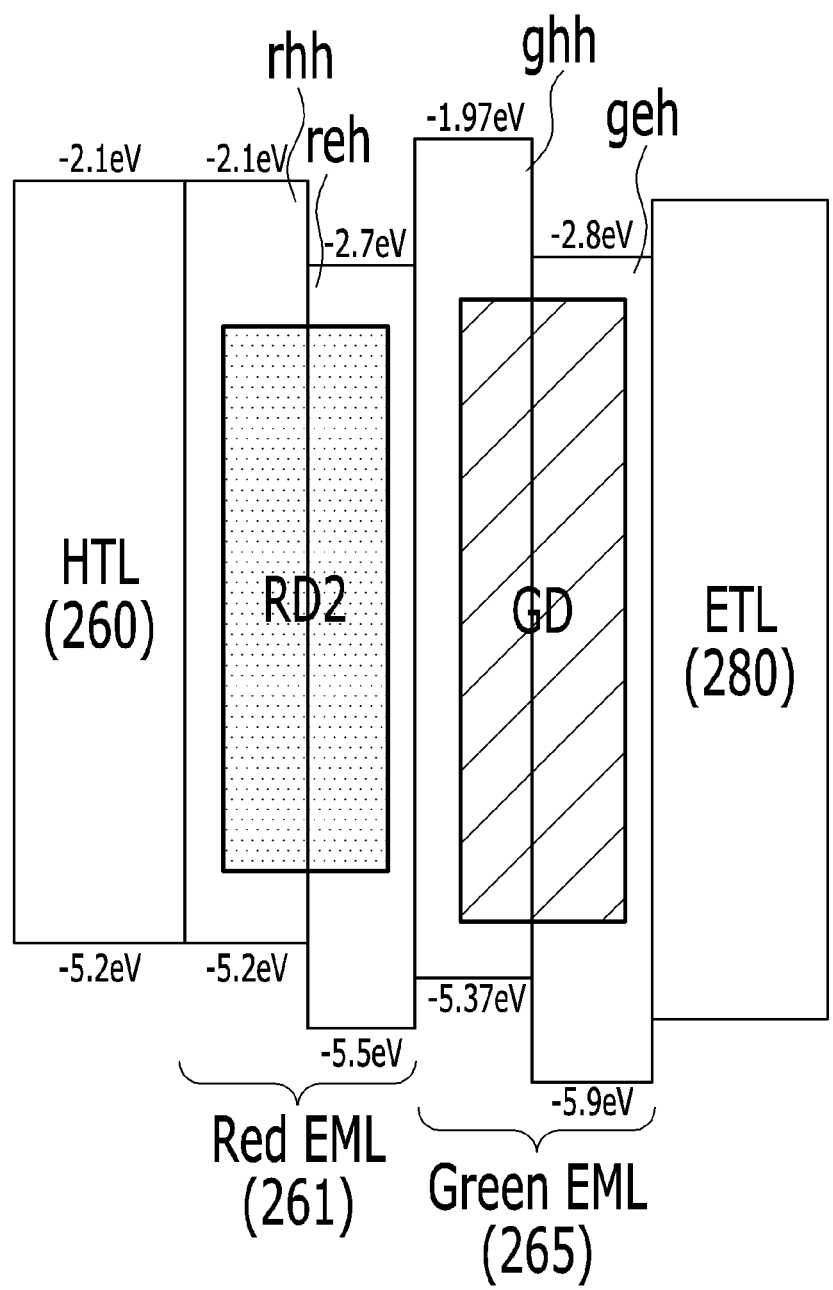
FIGS. 5A and 5B are diagrams illustrating a configuration of a phosphorescent unit according to first and third experimental examples.
Figure 5B:
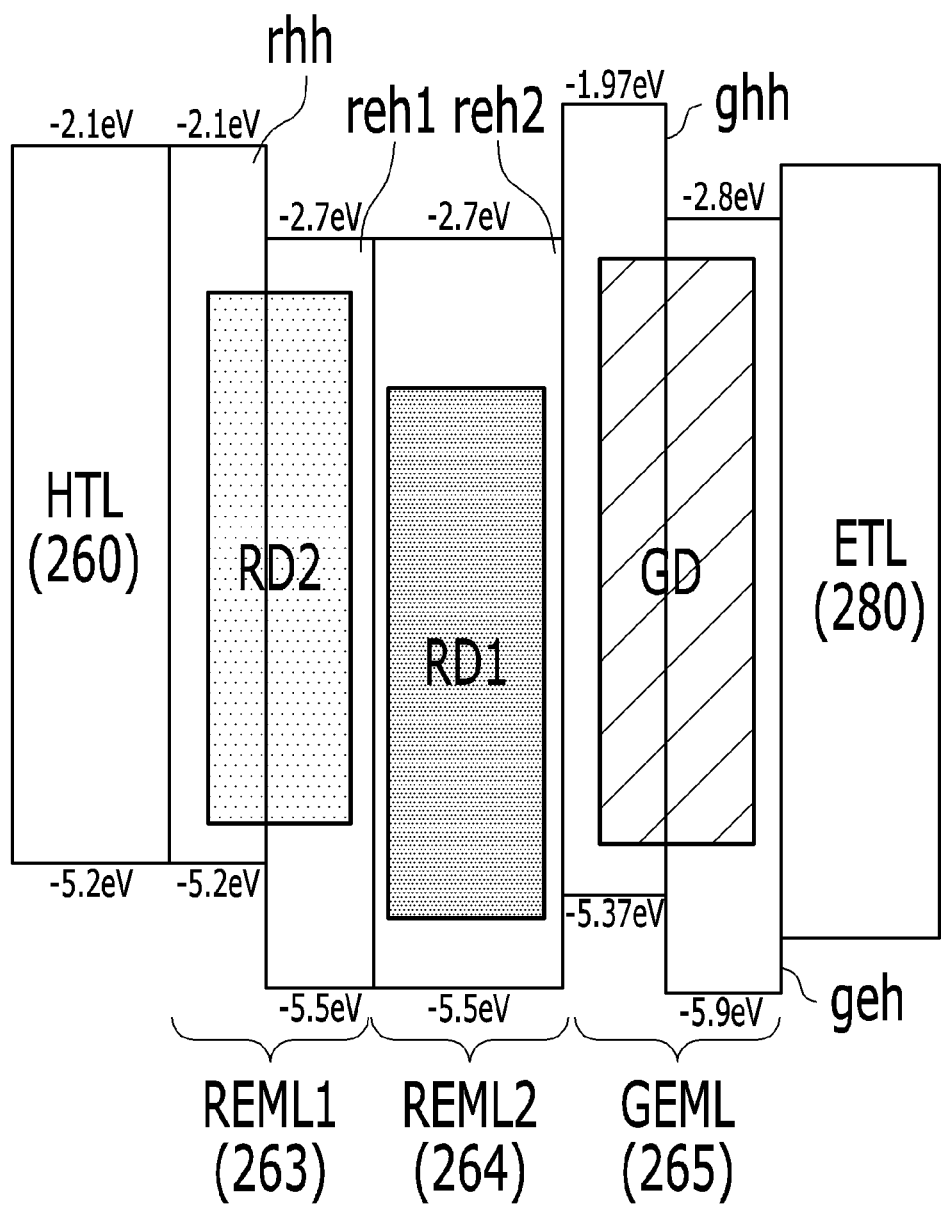
Figure 6:
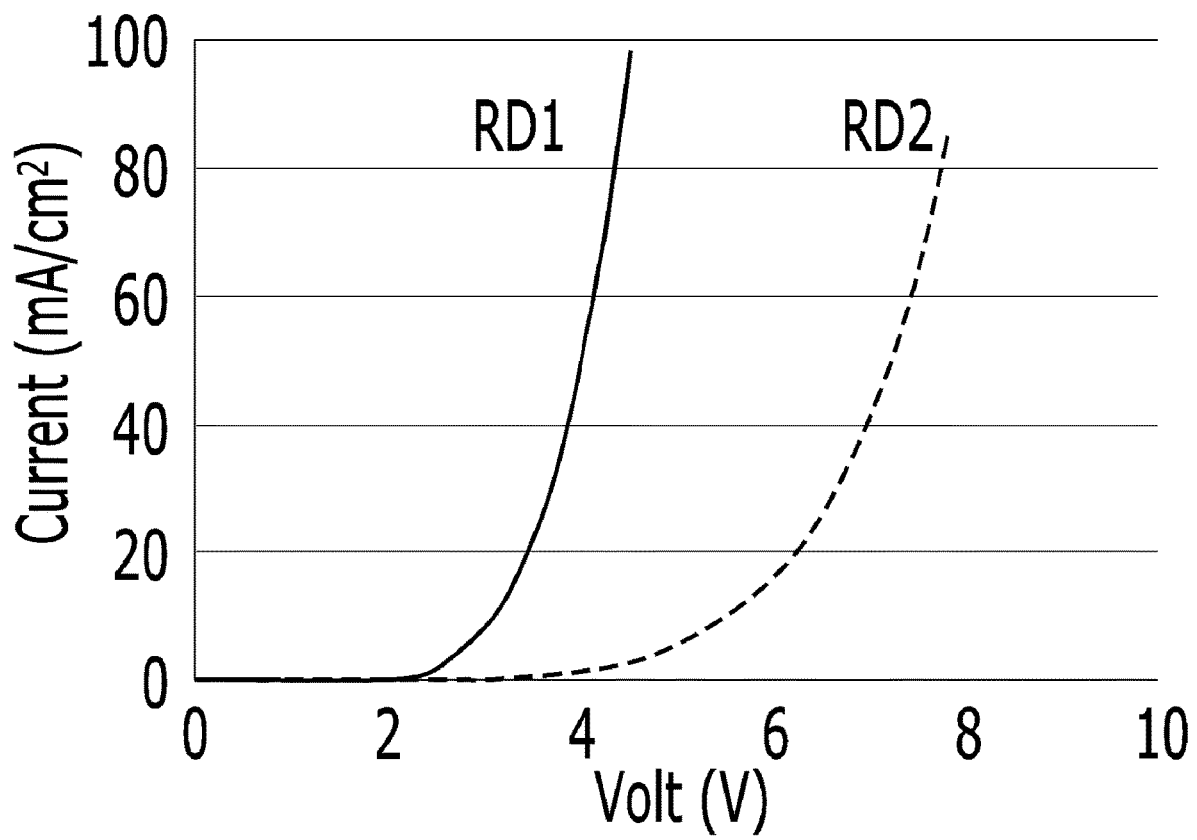
FIG. 6 is a graph illustrating a relationship between driving voltage and current density for first and second phosphorescent dopants in an HOD.
Figure 7:
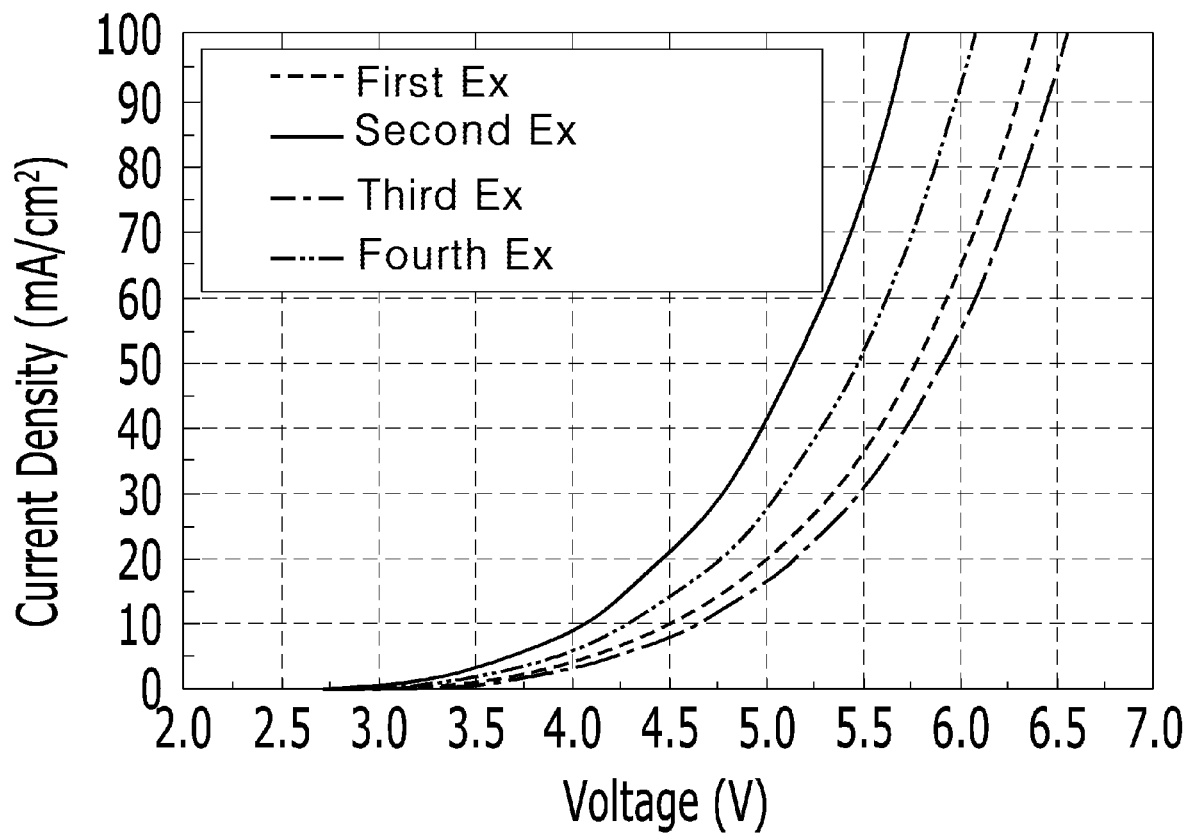
FIG. 7 is a graph illustrating a relationship between driving voltage and current density in first to fourth experimental examples of the present disclosure.
Figure 8A:
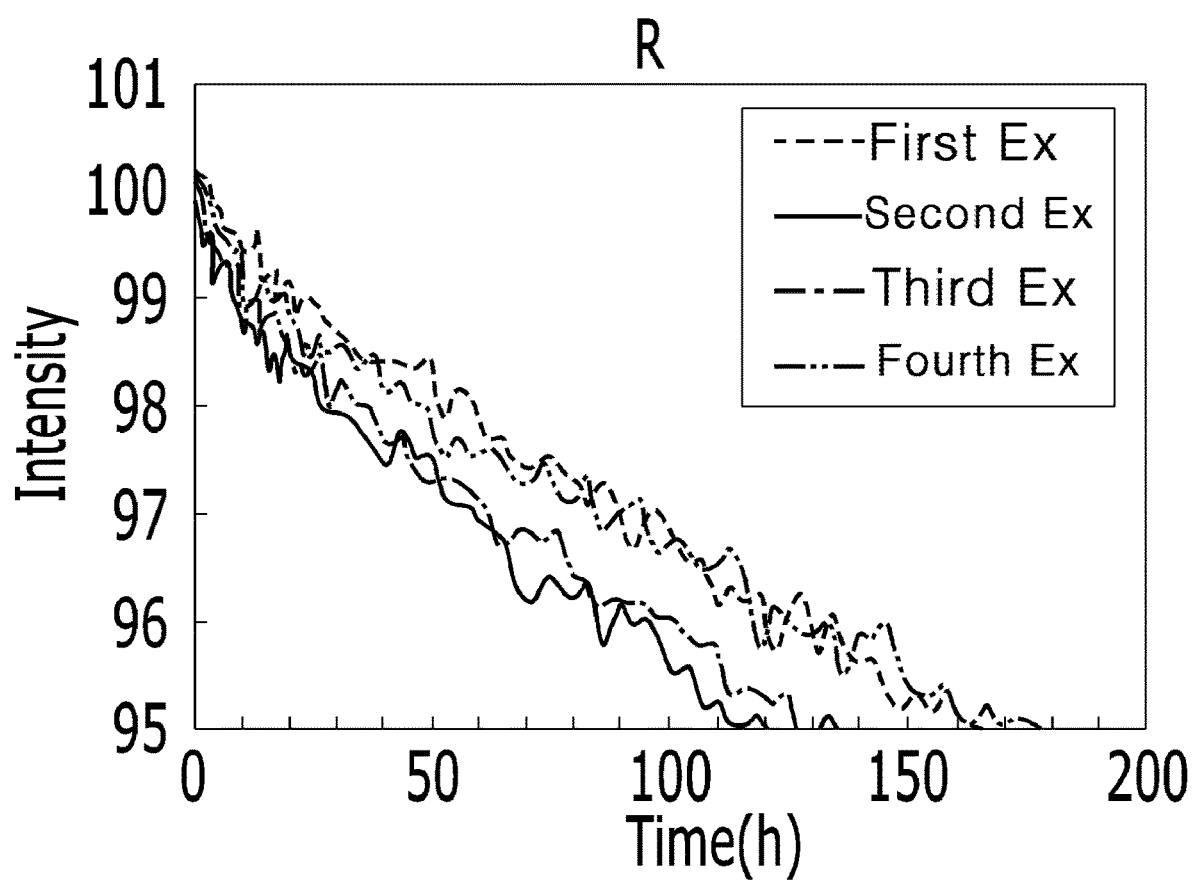

FIGS. 5A and 5B are diagrams illustrating a configuration of a phosphorescent unit according to first and third experimental examples (First Ex and Third Ex). FIG. 6 is a graph illustrating a relationship between driving voltage and current density for first and second phosphorescent dopants in an HOD. FIG. 7 is a graph illustrating a relationship between driving voltage and current density in first to fourth experimental examples (First Ex to Fourth Ex) of the present disclosure. FIGS. 8A and 8B are graphs illustrating lifetimes of red and green emission layers in the first to fourth experimental examples (First Ex to Fourth Ex).

The fourth experimental example (Fourth Ex) is based on the configuration of FIGS. 2A and 2B, respectively, and the first and third experimental examples (First Ex and Third Ex) are based on the configuration of the phosphorescent stack of FIGS. 5A and 5B, respectively. In each experimental example, an ITO anode electrode is provided under a hole transport layer and an Al cathode electrode is provided on an electron transport layer in order to apply a voltage therebetween to measure efficiency, color coordinates, and lifetime.

In all of the first to fourth experimental examples (First Ex to Fourth Ex), an ITO anode electrode (not shown) is deposited to a thickness of 1200 Å on a substrate, a hole injection layer (not shown) is deposited to a thickness of 70 Å on the ITO anode electrode, and a hole transport layer 160 or 260 is deposited to a thickness of 50 Å with a biphenylamine compound. Next, a phosphorescent unit having configurations of different types of emission layers to be described later is provided for each experimental example. Subsequently, an electron transport layer 180 or 280 is formed to a thickness of 180 Å with an anthracene compound, and an Al cathode electrode is then formed to a thickness of 240 Å.

The phosphorescent stack of the first experimental example (First Ex) according to FIG. 5A includes a hole transport layer 260, a red emission layer 261 having a second phosphorescent dopant RD2 (red dopant used in the second phosphorescent layer of the present invention), a green emission layer 265 having a green dopant GD, and an electron transport layer 280, which are stacked in sequence.

The red emission layer 261 is configured such that the second phosphorescent dopant RD2 is included, in its hole transport host rhh and electron transport host reh made of the same material as the adjacent hole transport layer 260, and has a higher HOMO energy level than the hole transport layer 260. The HOMO energy level of the hole transport layer 260 is approximately −5.2 eV, and the HOMO energy level of the second phosphorescent dopant RD2 is approximately −5.0 eV. Although not described herein, the LUMO energy level of the hole transport layer 260 is −2.1 eV, and the LUMO and HOMO energy levels of the electron transport host reh are −2.7 eV and −5.5 eV, respectively.

The green emission layer 265 is configured such that the green dopant GD is included in the hole transport host ghh and electron transport host geh thereof. The LUMO and HOMO energy levels of the hole transport host ghh are −1.97 eV and −5.37 eV, respectively, and the LUMO and HOMO energy levels of the electron transport host geh are −2.8 eV and −5.9 eV, respectively.

The phosphorescent stack of the second experimental example includes (Second Ex) a hole transport layer 260, a red emission layer 262 having a first phosphorescent dopant RD1 (dopant used in the first phosphorescent layer of the present disclosure), a green emission layer 265 having a green dopant GD, and an electron transport layer 280, which are stacked in sequence. In the phosphorescent stack of the second experimental example (Second Ex), the first dopant RD1, having a low HOMO energy level, is used in place of the second dopant RD2 used in the above first experimental example (First Ex).

The second experimental example (Second Ex) is identical to the first experimental example (First Ex) in terms of the configurations and materials of the hole transport layer 260, the green emission layer 265, and the electron transport layer 280, with the sole exception of the configuration of the red emission layer.

The red emission layer of the second experimental example (Second Ex) is configured such that the first phosphorescent dopant RD1 is included in an electron transport host reh adjacent thereto and has a lower HOMO energy level than the hole transport layer 260. The HOMO energy level of the hole transport layer 260 is approximately −5.2 eV, and the HOMO energy level of the first phosphorescent dopant RD1 is approximately −5.3 eV. The LUMO and HOMO energy levels of the electron transport host reh are −2.7 eV and −5.5 eV, respectively.

The phosphorescent stack of the third experimental example (Third Ex) according to FIG. 5B includes a hole transport layer 260, first and second red emission layers 263 and 264 adjacent to the hole transport layer 260, a green emission layer 265 having a green dopant GD on the second red emission layer 264, and an electron transport layer 280, which are stacked in sequence, wherein the first red emission layer 263 is configured as the red emission layer of the above first experimental example (First Ex) and the second red emission layer 264 is configured as the red emission layer of the above second experimental example (Second Ex).

The third experimental example (Third Ex) is identical to the first and second experimental examples (First and Second Exs) in terms of the configurations and materials of the hole transport layer 260, the green emission layer 265, and the electron transport layer 280, with the sole exception of a two-layered red emission layer, i.e., the configuration of the first and second red emission layers 263 and 264.

The first red emission layer 263 of the third experimental example (Third Ex) has a second phosphorescent dopant RD2, which is included in its hole transport host rhh and electron transport host reh made of the same material as the adjacent hole transport layer 260 and has a higher HOMO energy level than the hole transport layer 260. The HOMO energy level of the hole transport layer 260 is approximately −5.2 eV, and the HOMO energy level of the second phosphorescent dopant RD2 is approximately −5.0 eV. The LUMO and HOMO energy levels of the electron transport host reh are −2.7 eV and −5.5 eV, respectively.

The second red emission layer 264 has a first phosphorescent dopant RD1, which is included in its electron transport host reh and has a lower HOMO energy level than the hole transport layer 260. The HOMO energy level of the first phosphorescent dopant RD1 is −5.3 eV. The LUMO and HOMO energy levels of the electron transport host reh are −2.7 eV and −5.5 eV, respectively.

The fourth experimental example (Fourth Ex) is based on the configuration of the phosphorescent stack of the white organic light-emitting device of the present disclosure, as illustrated in FIG. 4, which uses the first red emission layer 171, including the first dopant RD1 having a low HOMO energy level and in contact with the hole transport layer 160, and the second red emission layer 172 including the second dopant RD2 having a relatively higher HOMO energy level than the first dopant RD1. In the fourth experimental example (Fourth Ex), the first and second red emission layers are disposed in the reverse order of the third experimental example (Third Ex).

In all of the first to fourth experimental examples (First to Fourth Exs), the green emission layer includes the hole transport host and the electron transport host at a ratio of 6:4, and 15 wt % of the green dopant, and the thickness of the green emission layer is 350 Å.

In the first and second experimental examples (First and Second Exs), the thickness of the red emission layer 261 or 262 is 150 Å. In the third and fourth experimental examples (Third and Fourth Exs), the total thickness of the two-layered red emission layer 263/264 or 171/172 is 150 Å, and the two-layered red emission layer, namely, the individual first red emission layer 263 or 171 and second red emission layer 264 or 172 have the same thickness, specifically 75 Å. The red dopant RD1 or RD2 included in each red emission layer is doped, in an amount of 3 wt %, in its host.

In the red emission layer 261 and first red emission layer 263, which are in contact with the hole transport layer, of the first and third experimental examples (First and Third Exs), and the second phosphorescent layer 172 of the fourth experimental example (Fourth Ex), the second red dopant RD2 is doped, in an amount of 3 wt %, in a structure in which the hole transport host and the electron transport host are mixed at a ratio of 4:6. In the red emission layer 262 of the second experimental example (Second Ex), the second red emission layer 264 of the third experimental example (Third Ex), and the first phosphorescent layer 171 of the fourth experimental example (Fourth Ex), the first red dopant RD1 is doped, in an amount of 3 wt %, in a single electron transport host.

First, the results of measuring J-V characteristics in an HOD (hole only device) to examine driving voltage versus current density characteristics for first and second phosphorescent dopants RD1 and RD2 will be described.

Here, the HOD is manufactured as illustrated in FIG. 6 to observe J-V (variation in driving voltage versus current density) characteristics according to the change of the red dopants.

The HOD is a device formed by stacking a first electrode, a hole injection layer, a hole transport layer, and red emission layers, which contain an ITO component, and a second electrode containing an Al component, to observe only a change in hole transport.

The first phosphorescent dopant RD1 refers to a compound of thieno-pyrimidine and iridium, as in the above-mentioned Formula 1, and the second phosphorescent dopant RD2 refers to a compound of triphenylamine and iridium, as in the above-mentioned Formula 2 or 3.

Each red emission layer of the HOD includes a dopant in a concentration of 3 wt %, and a hole transport host and an electron transport host at a ratio of 4:6.

According to the result of measuring driving voltages and current densities by changing only the first and second phosphorescent dopants RD1 and RD2 in the red emission layers of the HOD, it can be seen in FIG. 6 that the first phosphorescent dopant RD1, having a lower energy HOMO level than the hole transport layer, has a large variation in current density even with a small variation in driving voltage. Accordingly, when the first phosphorescent dopant RD1 is applied under the same conditions, it is possible to reduce the driving voltage of the device.

The following Table 1 shows that Driving Voltage 1 and Driving Voltage 2 are measured with respect to current densities of 10 mA/cm$^2$ and 100 mA/cm$^2$ under the conditions of low and high currents, respectively.

A single device, which includes the phosphorescent stack of the first to fourth experimental examples (First to Fourth Exs) between the first electrode and the second electrode, was evaluated. As a result, it can be seen in FIG. 7 and Table 1 that the variation in current density with driving voltage is large in the third experimental example (Third Ex), followed by the first experimental example (First Ex), the fourth experimental example (Fourth Ex), and the second experimental example (Second Ex). That is, when the first phosphorescent dopant is provided in contact with the hole transport layer, it can be seen that a lower driving voltage is required for the same level of current density.

According to the result of examining the lifetimes of the red and green emission layers in the first to fourth experimental examples (First Ex to Fourth Ex), it can be seen in FIGS. 8A and 8B and Table 1 that the lifetimes of both the red and green emission layers are increased or maximized in the fourth experimental example (Fourth Ex). That is, it can be seen that the driving voltage decreases, and at the same time that the lifetimes of the red and green emission layers increase, in the fourth experimental example (Fourth Ex), in which the first phosphorescent dopant RD1 having a low HOMO energy level is applied to the first phosphorescent layer 171 having only the electron transport host and the second phosphorescent dopant RD2 having a higher HOMO energy level than the hole transport layer is applied to the second phosphorescent layer 172 having the mixed structure of the electron transport host and the hole transport host, as in the configuration of the present disclosure.

TABLE 1

| Sort | Driving Voltage 1 (V) | Driving Voltage 2 (V) | EQE | Red Efficiency (Cd/A) | CIEx | CIEy | T95 (%) | Green Efficiency (Cd/A) | CIEx | CIEy | T95 (%) |
|---|---|---|---|---|---|---|---|---|---|---|---|
| First Ex | 4.5 | 6.4 | 21.0 | 6.6 | 0.691 | 0.315 | 100 | 20.7 | 0.243 | 0.728 | 100 |
| Second Ex | 4.1 | 5.7 | 20.7 | 4.9 | 0.687 | 0.318 | 75 | 24.9 | 0.243 | 0.728 | 80 |
| Third Ex | 4.7 | 6.6 | 20.8 | 6.4 | 0.692 | 0.314 | 87 | 20.6 | 0.243 | 0.729 | 100 |
| Fourth Ex | 4.3 | 6.0 | 22.2 | 6.4 | 0.689 | 0.317 | 110 | 23.7 | 0.243 | 0.729 | 100 |

Hereinafter, a fifth experimental example is prepared in which the phosphorescent stack of the first experimental example is applied to the triple-stacked white light-emitting device of FIG. 4. A sixth experimental example is prepared in which the red emission layer of the phosphorescent stack of the first experimental example (First Ex) includes a hole transport host and an electron transport host at a ratio of 5:5. In each of the fifth and sixth experimental examples, the red emission layer has a single structure and the green emission layer is in direct contact with the red emission layer. Here, the thickness of the red emission layer is 150 Å. The red dopant of the red emission layer is doped in an amount of 3.5 wt % in the host, and the green dopant of the green emission layer is doped in an amount of 15 wt % in the host.

A seventh experimental example is prepared in which the phosphorescent stack of the fourth experimental example (Fourth Ex) is applied to the triple-stacked white light-emitting device of FIG. 4. An eighth experimental example is prepared in which the second phosphorescent layer of the phosphorescent stack of the fourth experimental example (Fourth Ex) includes a hole transport host and an electron transport host at a ratio of 4:6 and 3:7. Here, the thickness of each of the first and second red emission layers is 75 Å.

In all of the fifth to eighth experimental examples, the green emission layer includes a hole transport host and an electron transport host at a ratio of 6:4, and the thickness of the green emission layer is 350 Å.

Figure 9:
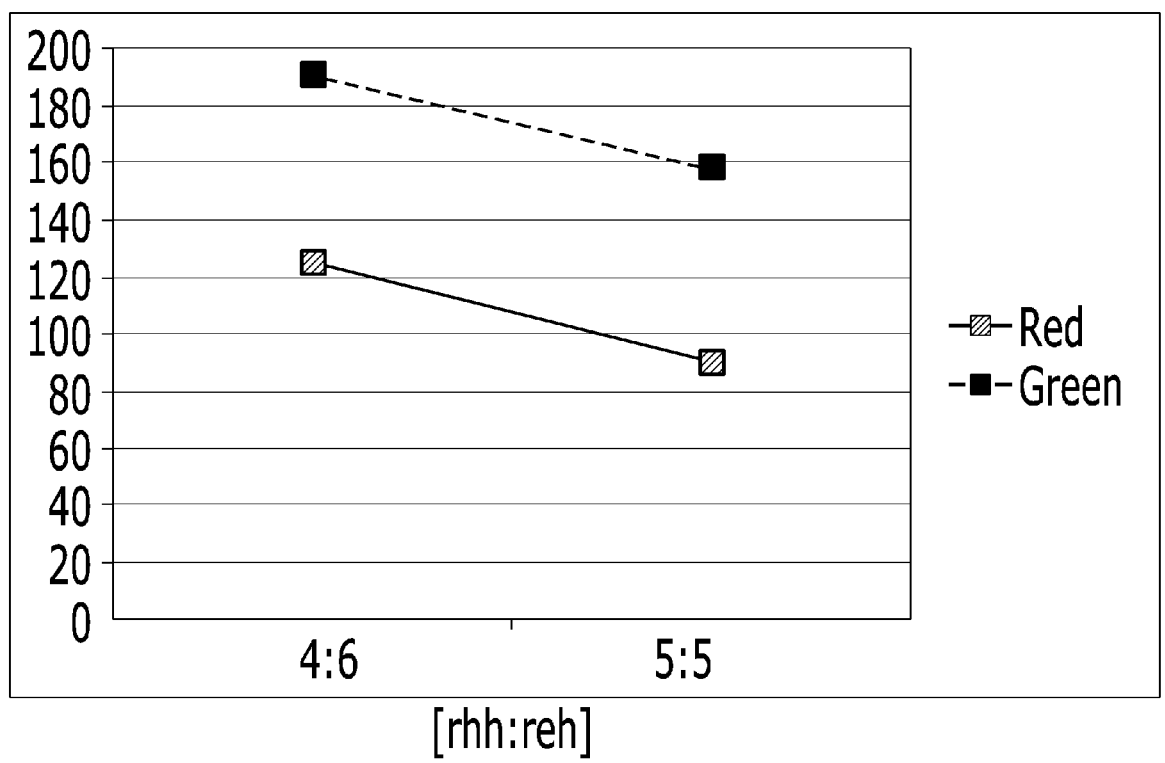
FIG. 9 is a graph comparing lifetimes of red and green emission layers in fifth and sixth experimental examples of the present disclosure.

FIG. 9 is a graph comparing the lifetimes of the red and green emission layers in the fifth and sixth experimental examples of the present invention. FIGS. 10A to 10D are graphs illustrating the lifetimes of the red and green emission layers in the respective fifth to eighth experimental examples of the present disclosure.

Figure 10A:
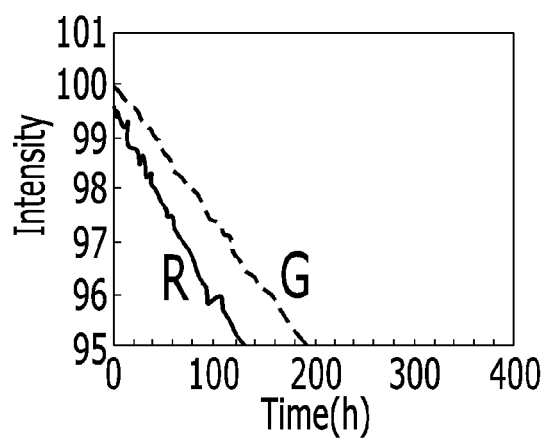
FIGS. 10A to 10D are graphs illustrating lifetimes of red and green emission layers in respective fifth to eighth experimental examples of the present disclosure.
Figure 10B:
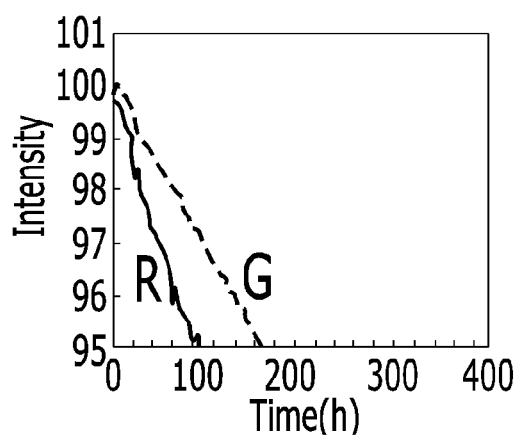
Figure 10C:
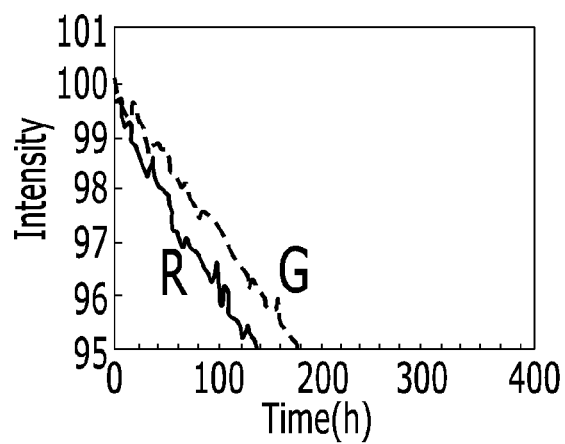
Figure 10D:
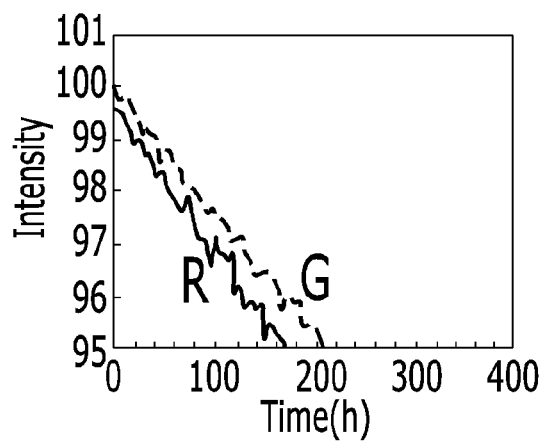

As illustrated in FIG. 9, in the fifth and sixth experimental examples, the red emission layers include the same second red dopant RD2, and the hole transport host is included in an increased amount by changing the ratio of the hole transport host to the electron transport host from 4:6 to 5:5. As a result, it can be clearly seen that 95% of initial luminance (T95) linearly decreases in lifetime. As illustrated in FIGS. 10A and 10B, the lifetime of the red emission layer is decreased by about 26% and the lifetime of the green emission layer is decreased by about 17% in the fifth and sixth experimental examples. It is understood that, as the amount of the hole transport host is increased in the red emission layer in contact with the hole transport layer, holes are pushed to the interface between the red emission layer and the green emission layer, so excitons are concentrated on that interface, resulting in a decrease in lifetime due to interface deterioration.

On the other hand, in the following Table 2 and the seventh and eighth experimental examples, the first phosphorescent layer 171 in contact with the hole transport layer has the same configuration as the fourth experimental example and is configured such that its first dopant RD1, having a lower HOMO energy level than the hole transport layer, is included in a single electron transport host. Accordingly, light may be emitted from the first phosphorescent layer 171 as well as the second phosphorescent layer 172 that interfaces with the green emission layer (third phosphorescent layer) 180. That is, since holes and/or electrons are not accumulated anywhere in the first to third phosphorescent layers 171, 172, and 175, it is possible to realize light emission in each phosphorescent layer 171, 172, or 175 and to improve the luminous efficiency of red light as well as the luminous efficiency of green light. In addition, since the accumulation of carriers is prevented at the interface between emission layers, it is possible to reduce the driving voltage of the device together with an increase in service life thereof according to the effective transfer and use of the carriers in the emitting layers.

Meanwhile, in the following Table 2 and the seventh and eighth experimental examples, the hole transport host and the electron transport host are included at a ratio of 4:6 to 7:3 in the second phosphorescent layer 172. As a result, it can be seen in FIGS. 10C and 10D that the lifetimes of both the green and red emission layers are improved. This result shows that including the electron transport host in a larger amount than the hole transport host even in the second phosphorescent layer 172 is more effective in improving the service life of the device.

In the case where the electron transport host is included in a larger amount than the hole transport host in the second phosphorescent layer 172, the ratio of the hole transport host to the electron transport host is 4:6 to 2:8. In order to transfer holes from the second phosphorescent layer 172 to the third phosphorescent layer 175, the hole transport host is preferably included in an amount of 20 wt % to 40 wt % in the second phosphorescent layer 172.

TABLE 2

| Sort | Driving Voltage 1 (V) | Driving Voltage 2 (V) | EQE | Red Efficiency (Cd/A) | CIEx | CIEy | T95 (%) | Green Efficiency (Cd/A) | CIEx | CIEy | T95 (%) |
|---|---|---|---|---|---|---|---|---|---|---|---|
| Experimental Example 5 | 12.2 | 15.09 | 32.3 | 6.9 | 0.690 | 0.310 | 100 | 21.3 | 0.222 | 0.721 | 100 |
| Experimental Example 6 | 12.1 | 15.01 | 32.2 | 6.5 | 0.689 | 0.311 | 74 | 22.7 | 0.221 | 0.723 | 83 |
| Experimental Example 7 | 12.9 | 14.8 | 34.8 | 6.9 | 0.687 | 0.312 | 110 | 24.8 | 0.231 | 0.717 | 98 |
| Experimental Example 8 | 12.1 | 15.0 | 34.5 | 7.0 | 0.689 | 0.311 | 130 | 23.3 | 0.231 | 0.715 | 110 |

The fifth to eighth experimental examples are provided with the same blue emission stack and charge generation layer, except that the experimental examples are provided with different phosphorescent stacks, as illustrated in FIGS. 5A and 2A. Unlike the first to fourth experimental examples provided with the single phosphorescent stack, the fifth to eighth experimental examples are provided with the plurality of emission stacks connected in series, resulting in an increase in driving voltage, and are provided with the blue emission stack, resulting in a tendency to increase luminous efficiency with regard to white light emission.

Figure 11:
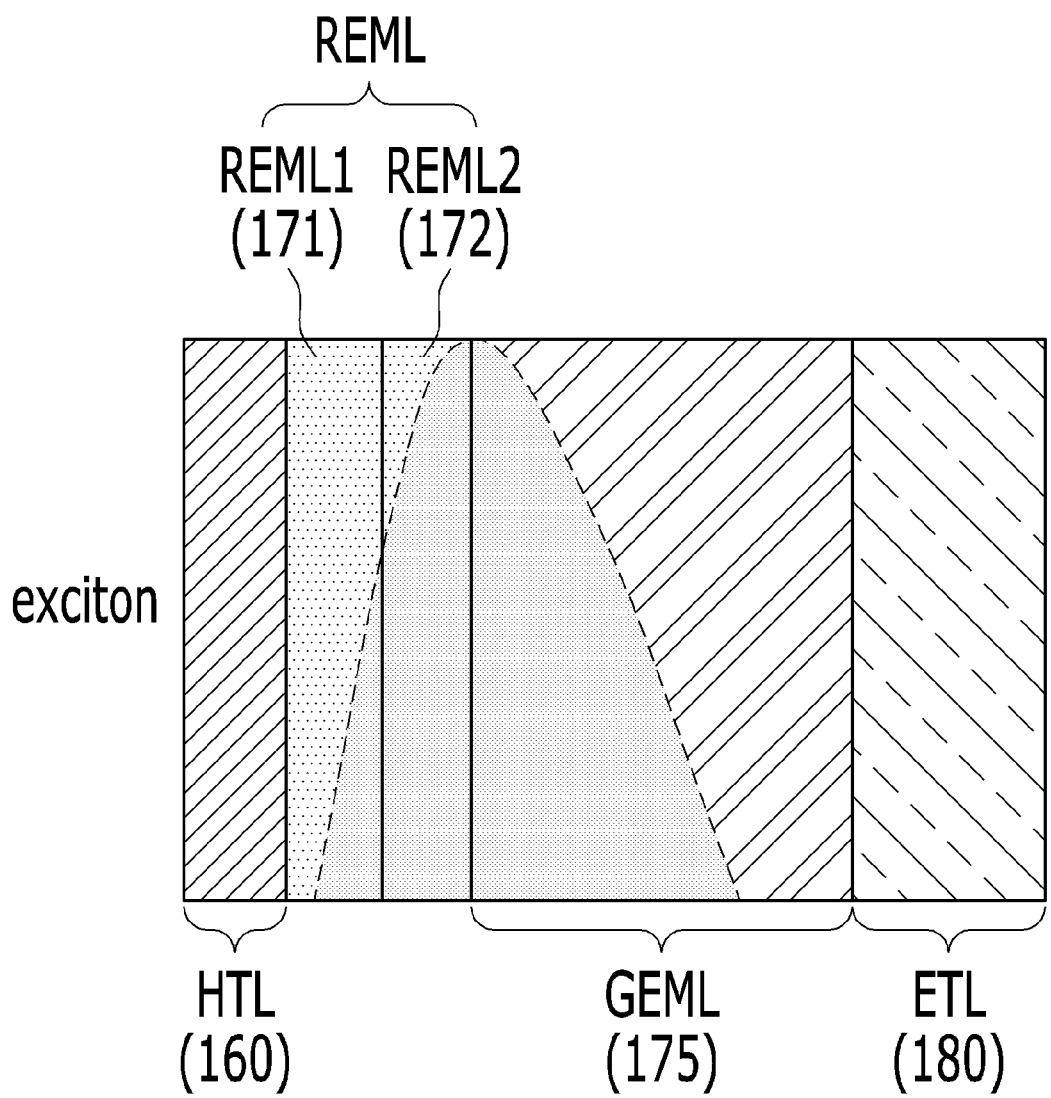
FIG. 11 is a diagram illustrating a luminescent zone of a phosphorescent unit in the white organic light-emitting device of the present disclosure.

FIG. 11 is a diagram illustrating the luminescent zone of the phosphorescent unit in the white organic light-emitting device of the present disclosure.

In the white organic light-emitting device of the present disclosure illustrated in FIG. 4, as illustrated in FIG. 11, the light emission distribution in the first to third phosphorescent layers 171, 172, and 175 shows that the interface between the second and third phosphorescent layers has a great luminescence intensity due to the concentration of the majority of excitons thereon, the emission of green light tends to gradually decrease to above the center of the third phosphorescent layer in the thickness direction thereof, and the emission of red light tends to gradually decrease in the order of the second and first phosphorescent layers. That is, the white organic light-emitting device of the present disclosure can prevent the concentration of excitons on a specific interface to evenly emit light from the first to third phosphorescent layers and prevent interface deterioration. In addition, the white organic light-emitting device of the present disclosure can adjust the amount of the single/mixed host in the first to third phosphorescent layers, thereby preventing variability in the luminescent zone for uniform color display.

Figure 12A:
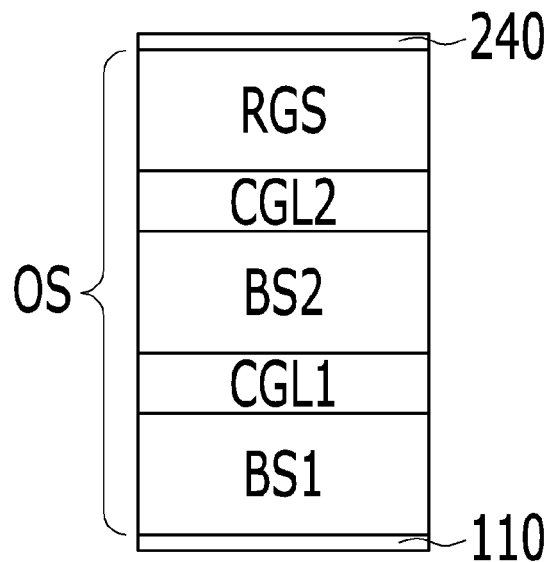
FIGS. 12A and 12B are cross-sectional views illustrating a white organic light-emitting device according to other embodiments of the present disclosure.
Figure 12B:
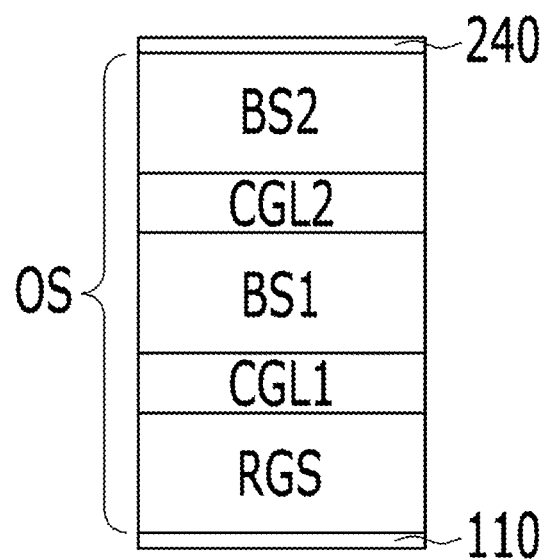

FIGS. 12A and 12B are cross-sectional views illustrating a white organic light-emitting device according to other embodiments of the present disclosure.

FIG. 12A illustrates a white organic light-emitting device according to a second embodiment, which includes emission stacks, consisting of a first blue emission stack BS1, a second blue emission stack BS2, and a phosphorescent stack RGS provided in that order, between a first electrode 110 and a second electrode 240.

Even in this case, the phosphorescent stack RGS may further include the first to third phosphorescent layers 171, 172, and 175 described with reference to FIGS. 2A and 2B, or an additional fourth phosphorescent layer. Thus, it is possible to prevent holes from being trapped at the interface between the hole transport layer and the first phosphorescent layer and to evenly distribute excitons on the first to third phosphorescent layers 171, 172, and 175, thereby obtaining an improvement in efficiency, prevention of interface deterioration, and an increase in service life.

The charge generation layers described above may be provided between the respective emission stacks BS1, BS2, and RGS.

FIG. 12B illustrates a white organic light-emitting device according to a third embodiment, which includes emission stacks, consisting of a phosphorescent stack RGS, a first blue emission stack BS1, and a second blue emission stack BS2 provided in that order, between a first electrode 110 and a second electrode 240.

In addition, the phosphorescent stack RGS of the white organic light-emitting device according to the third embodiment may further include the first to third phosphorescent layers 171, 172, and 175 described with reference to FIGS. 2A and 2B, or an additional fourth phosphorescent layer. Thus, it is possible to prevent holes from being trapped at the interface between the hole transport layer and the first phosphorescent layer and to evenly distribute excitons on the first to third phosphorescent layers 171, 172, and 175, thereby obtaining an improvement in efficiency, prevention of interface deterioration, and an increase in service life.

The charge generation layers described above may be provided between the respective emission stacks BS1, BS2, and RGS.

In the white organic light-emitting device according to the second and third embodiments, it is preferable that an emission layer in each of the emission stacks be located at a position where optimal resonance is generated at the wavelength of the light emitted from the emission layer. When a blue emission layer and an emission layer different therefrom are located in a stack configured in an order different from that illustrated in FIG. 1 between the first and second electrodes 110 and 240, the distance between the emission layers and the first electrode may be adjusted by changing the thickness of the charge generation layer 150 and 190 adjacent to each emission layer or the thickness of the hole transport unit 120 or 210 provided in the emission layer.

Although FIGS. 1, 12A, and 12B illustrate an example in which the three emission stacks are provided between the first electrode 110 and the second electrode 240, another blue emission stack or phosphorescent stack may be further provided between the first electrode 110 and the second electrode 240 in order to further improve luminous efficiency.

Figure 13A:
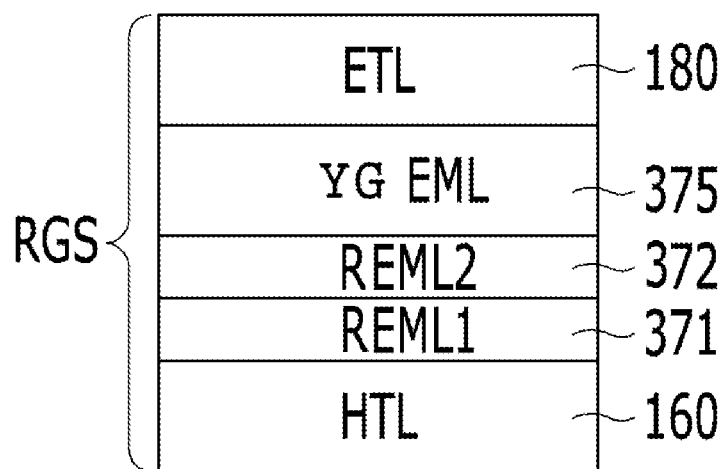
FIGS. 13A to 13C are cross-sectional views schematically illustrating configurations of other phosphorescent units according to an embodiment of the present disclosure.
Figure 13B:
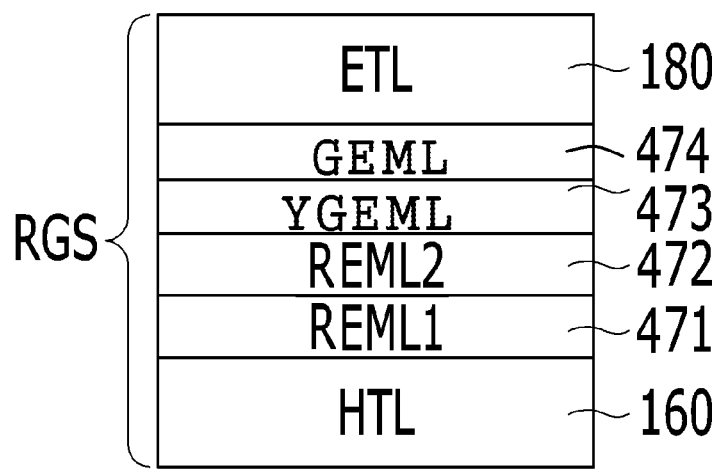
Figure 13C:
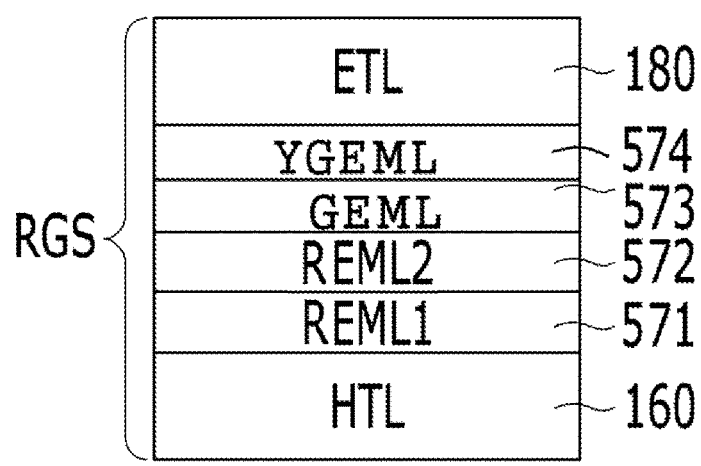

FIGS. 13A to 13C are cross-sectional views schematically illustrating configurations of other phosphorescent units.

As illustrated in FIG. 13A, the phosphorescent unit may include a hole transport layer 160, a first red emission layer 371 having a HOMO energy level lower than the HOMO energy level of the hole transport layer 160, a second red emission layer 372 having a HOMO energy level higher than the HOMO energy level of the hole transport layer 160, a yellow-green emission layer 375, and an electron transport layer 180 in sequence.

The difference in luminescence peak between the first and second red emission layers 371 and 372 is within a wavelength of 10 nm. The first and second red emission layers 371 and 372 have a luminescence peak at a wavelength of 600 nm to 640 nm. The yellow-green emission layer 373 has a luminescence peak at a wavelength of 540 nm to 590 nm.

Except for the yellow-green emission layer 375, the remainder is the same as the configuration of the phosphorescent stack of the present disclosure described with reference to FIGS. 2A to 2B. In other words, the first red emission layer 371 is configured such that the first phosphorescent dopant RD1 is included in the single hole transport host, and the second red emission layer 372 is configured such that the second phosphorescent dopant RD2 is included in the mixed structure of the hole transport host and the electron transport host. Here, the amount of the electron transport host is greater than that of the hole transport host.

The yellow-green emission layer 375 is similar to the above-mentioned green emission layer 175, with the sole exception of a dopant. The yellow-green emission layer 375 includes a hole transport host and an electron transport host, wherein the hole transport host is included in a larger amount than the electron transport host. The yellow-green emission layer 375 includes a yellow-green dopant in an amount of 5 wt % to 19 wt %.

As illustrated in FIG. 13B, the phosphorescent unit may include a hole transport layer 160, a first red emission layer 471 having a HOMO energy level lower than the HOMO energy level of the hole transport layer 160, a second red emission layer 472 having a HOMO energy level higher than the HOMO energy level of the hole transport layer 160, a yellow-green emission layer 473, and a green emission layer 474 in sequence.

Except for the yellow-green emission layer 473, the remainder is the same as the configuration of the phosphorescent stack of the present invention described with reference to FIGS. 2A to 2B. In other words, the first red emission layer 471 is configured such that the first phosphorescent dopant RD1 is included in the single hole transport host, and the second red emission layer 472 is configured such that the second phosphorescent dopant RD2 is included in the mixed structure of the hole transport host and the electron transport host.

As another example, as illustrated in FIG. 13C, the phosphorescent unit may include a hole transport layer 160, a first red emission layer 571 having a HOMO energy level lower than the HOMO energy level of the hole transport layer 160, a second red emission layer 572 having a HOMO energy level higher than the HOMO energy level of the hole transport layer 160, a green emission layer 573, and a yellow-green emission layer 574 in sequence.

Each of the phosphorescent units illustrated in FIGS. 13A to 13C may be applied to one of the stacks of the white organic light-emitting device illustrated in FIGS. 1, 12A, and 12B, so that the blue light, the red light, the green light, and the like from the phosphorescent unit are combined and radiated to realize white display.

Figure 14:
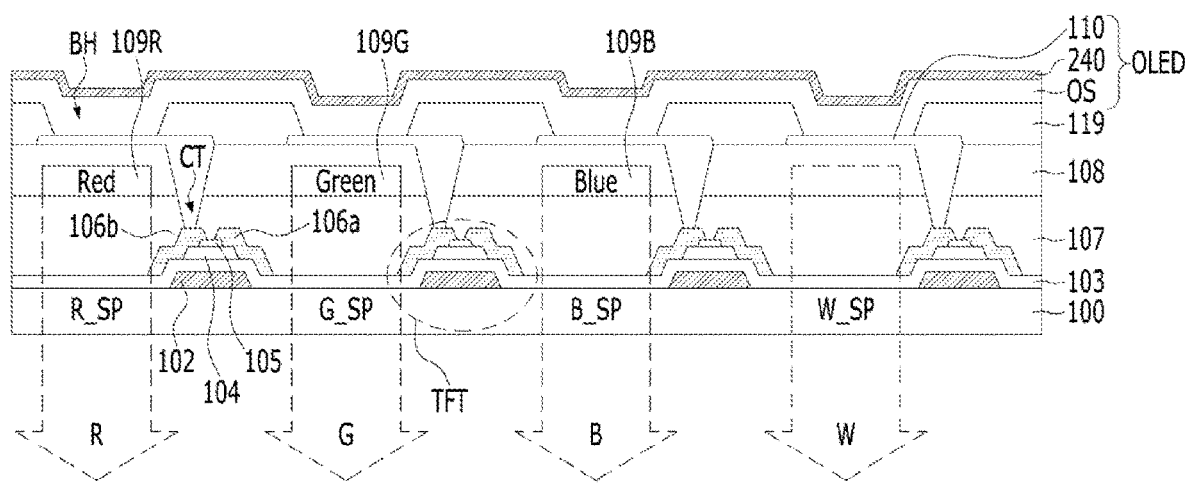
FIG. 14 is a cross-sectional view illustrating a display device according to an embodiment of the present disclosure.

FIG. 14 is a cross-sectional view illustrating a display device according to the present disclosure.

As illustrated in FIG. 14, the display device of the present disclosure may include a substrate 100 having a plurality of sub-pixels R_SP, G_SP, B_SP, and W_SP, a white organic light-emitting device OLED, which is illustrated in FIG. 1 or 12A or 12B, provided in common in the sub-pixels R_SP, G_SP, B_SP, and W_SP of the substrate 100, thin film transistors TFT provided in the respective sub-pixels and connected to a first electrode 110 of the white organic light-emitting device OLED, and color filters 109R, 109G, and 109B provided in one or more of the sub-pixels beneath the first electrode 110.

Although the illustrated example has been described as including the white sub-pixel W_SP, the present disclosure is not limited thereto. For example, the white sub-pixel W_SP may be removed, and only the red, green, and blue sub-pixels R_SP, G_SP, and B_SP may be provided.

Each of the thin film transistors TFT includes, for example, a gate electrode 102, a semiconductor layer 104, and source and drain electrodes 106a and 106b connected to both sides of the semiconductor layer 104.

A gate insulating layer 103 is provided between the gate electrode 102 and the semiconductor layer 104.

The semiconductor layer 104 may be made of, for example, amorphous silicon, polycrystalline silicon, oxide semiconductor, or a combination of two or more thereof. For example, when the semiconductor layer 104 is made of the oxide semiconductor, an etch stopper 105 may be further provided directly on the semiconductor layer 104 to prevent damage to the channel portion of the semiconductor layer 104.

The drain electrode 106b of the thin film transistor TFT may be connected to a contact hole CT region provided in the first electrode 110 and first and second passivation layers 107 and 108.

The first passivation layer 107 is primarily provided to protect the thin film transistor TFT, and the color filters 109R, 109G, and 109B may be provided on the first passivation layer 107.

When the sub-pixels consist of a red sub-pixel, a green sub-pixel, a blue sub-pixel, and a white sub-pixel, the color filters consist of first to third color filters 109R, 109G, and 109B provided in the remaining sub-pixels excluding the white sub-pixel W_SP. The white light emitted through the first electrode 110 passes through the color filters for each wavelength. The second passivation layer 108 is formed beneath the first electrode 110 to cover the first to third color filters 109R, 109G, and 109B. The first electrode 110 is formed on the surface of the second passivation layer 108, except for the contact hole CT.

The white organic light-emitting device OLED includes a first transparent electrode 110 and a second reflective electrode 240 facing the first electrode 110. In this case, the white organic light-emitting device OLED refers to a double-stacked structure that includes a blue emission stack BS1 and a phosphorescent stack of FIGS. 2A and 2B, with a charge generation layer provided therebetween, between the first and second electrodes 110 and 240, or a triple-stacked structure that includes a first blue emission stack BS, a long-wavelength stack RGS, and a second blue emission stack BS2 as illustrated in FIG. 1.

Reference numeral 119, which is not described herein, refers to banks, and reference numeral BH refers to a bank hole between the banks. Since light is radiated on an open region through the bank hole, the bank hole is defined as an emission unit of each sub-pixel.

The display device of FIG. 14 is an example of a bottom-emission-type display device.

However, the display device of the present disclosure is not limited to this example. For example, the display device of the present disclosure may be a top-emission-type display device, formed by modifying the structure of the display device illustrated in FIG. 14, in which the color filters are located above the second electrode 240, the first electrode 110 is used as a reflective electrode, and the second electrode 240 is used as a transparent electrode or is made of semi-transmissive metal.

Alternatively, a transparent organic light-emitting device may be implemented in which the color filters are optionally removed and both the first and second electrodes 110 and 240 are used as transparent electrodes.

The display device including the white organic light-emitting device of the present disclosure includes a phosphorescent stack configured such that a first dopant having a lower HOMO energy level than a hole transport layer is provided in a first phosphorescent layer in contact with the hole transport layer. Thus, carriers can be smoothly transferred from the first phosphorescent layer to rear emission layers adjacent thereto without being trapped at the first dopant in the zone adjacent to the hole transport layer.

The first phosphorescent layer allows hole transport due to the specific HOMO energy level relationship between the hole transport layer and the first dopant. In addition, in order to supply sufficient excitons to the first phosphorescent layer, which is far from an electron transport layer, the ratio of hosts in second and third phosphorescent layers is adjusted and the first phosphorescent layer has only an electron transport host. Thus, light is emitted even from the first phosphorescent layer added between the hole transport layer and the phosphorescent layer, thereby preventing the concentration of light emission at the interface between the phosphorescent layers of different colors. In addition, phosphorescence occurs across three or more phosphorescent layer, thereby preventing interface deterioration due to the concentration of excitons when light emission is concentrated at the interface. Therefore, it is possible to increase the service life of the device, to increase luminous efficiency thanks to the inclusion of at least three phosphorescent layers, and to realize rich color display. Ultimately, it is possible to increase the color temperature that is gradually required in the display device.

In this regard, the display device of the present disclosure can obtain an overall improvement in efficiency and service life by applying a tandem element, having multiple stacks including a phosphorescent stack, to an organic light-emitting device.

A white organic light-emitting device according to an embodiment of the present disclosure includes first and second electrodes facing each other, and a plurality of emission stacks, separated from each other by charge generation layers interposed therebetween, between the first electrode and the second electrode. At least one of the emission stacks may be a phosphorescent stack. The phosphorescent stack may include a hole transport layer, and first to third phosphorescent layers sequentially provided on the hole transport layer to each emit light having a longer wavelength than blue light. The first phosphorescent layer may include a first red dopant having a lower HOMO energy level than the hole transport layer. The second phosphorescent layer may include a second red dopant having a HOMO energy level higher than the HOMO energy level of the first red dopant. The third phosphorescent layer may include a third dopant having a luminescence peak at a shorter wavelength than the first and second dopants. Also, the third dopant has an electroluminescence peak at a shorter wavelength than the first and second dopants.

The first phosphorescent layer may include only an electron transport host. Each of the second and third phosphorescent layers may include an electron transport host and a hole transport host.

The phosphorescent stack may further include a fourth phosphorescent layer on the third phosphorescent layer. The third and fourth phosphorescent layers may emit light having a shorter wavelength than the light emitted from the first and second phosphorescent layers. In this case, the second to fourth phosphorescent layers may sequentially emit shorter-wavelength light.

The HOMO energy level of the second red dopant may be higher than that of the hole transport layer.

The electron transport host may be a compound having a triazine core, and the hole transport host may be a phenylamine compound or a biphenylamine compound.

The first dopant of the first phosphorescent layer may be included in an amount equal to or larger than the second dopant of the second phosphorescent layer. The first and second dopants may be included in an amount of 2 wt % to 9 wt % in the first and second phosphorescent layers, respectively. The third dopant may be included in an amount of 5 wt % to 19 wt % in the third phosphorescent layer.

The second phosphorescent layer may include the electron transport host in a larger amount than the hole transport host. The third phosphorescent layer may include the hole transport host in a larger amount than the electron transport host.

The first dopant may be a compound containing a combination of iridium and thieno-pyrimidine.

The first to third phosphorescent layers may include the same electron transport host.

The white organic light-emitting device may further include, between the first and second electrodes, at least one first blue emission stack between the first electrode and the phosphorescent stack, and at least one second blue emission stack between the phosphorescent stack and the second electrode. Each of the first and second blue emission stacks may include a blue fluorescent layer.

The white organic light-emitting device may further include, between the first and second electrodes, at least one blue emission stack between the first electrode and the phosphorescent stack or between the phosphorescent stack and the second electrode. The blue emission stack may include a blue fluorescent layer.

The first and second phosphorescent layers may each have a luminescence peak at a wavelength of 600 nm to 640 nm, and the third phosphorescent layer may have a luminescence peak at a wavelength of 500 nm to 540 nm.

The first and second phosphorescent layers may each have a luminescence peak at a wavelength of 600 nm to 640 nm, the third phosphorescent layer may have a luminescence peak at a wavelength of 540 nm to 580 nm, and the fourth phosphorescent layer may have a luminescence peak at a wavelength of 500 nm to 540 nm.

In order to achieve the same object, a display device according to an embodiment of the present disclosure includes a substrate having a thin film transistor in each of a plurality of sub-pixels, a first electrode connected to the thin film transistor in the sub-pixel, a second electrode spaced apart from the first electrode and provided across the sub-pixels, and a plurality of emission stacks, separated from each other by charge generation layers interposed therebetween, between the first electrode and the second electrode. At least one of the emission stacks may be a phosphorescent stack. The phosphorescent stack may include a hole transport layer, and first to third phosphorescent layers sequentially provided on the hole transport layer to each emit light having a longer wavelength than blue light. The first phosphorescent layer may include a first red dopant having a lower HOMO energy level than the hole transport layer. The second phosphorescent layer may include a second red dopant having a HOMO energy level higher than the HOMO energy level of the first red dopant. The third phosphorescent layer may include a third dopant having a luminescence peak at a shorter wavelength than the first and second dopants. Also, the third dopant has an electroluminescence peak at a shorter wavelength than the first and second dopants.

The display device may further include color filters, individually provided in the sub-pixels, beneath the first electrode or above the second electrode, so that each of the color filters transmits light having passed through the first or second electrode to emit a different color of light from sub-pixels adjacent to the color filter.

The first phosphorescent layer may include only an electron transport host. Each of the second and third phosphorescent layers may include an electron transport host and a hole transport host.

As is apparent from the above description, the white organic light-emitting device and the display device using the same according to the present disclosure have the following effects.

First, the phosphorescent stack is configured such that the first dopant having a lower HOMO energy level than the hole transport layer is provided in the first phosphorescent layer in contact with the hole transport layer. Thus, carriers can be smoothly transferred from the first phosphorescent layer to rear emission layers adjacent thereto without being trapped at the first dopant in the zone adjacent to the hole transport layer.

Second, the first phosphorescent layer allows hole transport due to the specific HOMO energy level relationship between the hole transport layer and the first dopant. In addition, in order to supply sufficient excitons to the first phosphorescent layer, which is far from the electron transport layer, the ratio of the hosts in the second and third phosphorescent layers is adjusted and the first phosphorescent layer has only the electron transport host. Thus, light is emitted even from the first phosphorescent layer added between the hole transport layer and the phosphorescent layer, thereby preventing the concentration of light emission at the interface between the phosphorescent layers of different colors. In addition, the phosphorescence occurs across three or more phosphorescent layer, thereby preventing interface deterioration due to the concentration of excitons when light emission is concentrated at the interface. Therefore, it is possible to increase the service life of the device, to increase luminous efficiency thanks to the inclusion of at least three phosphorescent layers, and to realize rich color display. Ultimately, it is possible to increase the color temperature that is gradually required in the display device.

It will be apparent to those skilled in the art that various modifications and variations can be made in the present disclosure without departing from the spirit or scope of the disclosure. Thus, it is intended that the present disclosure covers such modifications and variations to this disclosure provided they fall within the scope of the appended claims and their equivalents.

What is claimed is:

1. A white organic light-emitting device comprising:
a first electrode and a second electrode facing each other; and
a plurality of emission stacks, separated from each other by charge generation layers interposed therebetween, the plurality of emission stacks between the first electrode and the second electrode, wherein:
at least one of the plurality of emission stacks is a phosphorescent stack;
the phosphorescent stack comprises a hole transport layer, and a first phosphorescent layer on the hole transport layer, a second phosphorescent layer on the first phosphorescent layer, and a third phosphorescent layer on the second phosphorescent layer, each of the first phosphorescent layer, the second phosphorescent layer and the third phosphorescent layer to emit light having a longer wavelength than blue light;
the first phosphorescent layer comprises a first red dopant having a highest occupied molecular orbital (HOMO) energy level lower than or equal to a HOMO energy level of the hole transport layer;
the second phosphorescent layer comprises a second red dopant having a HOMO energy level higher than the HOMO energy level of the first red dopant; and
the third phosphorescent layer comprises a third dopant having a luminescence peak at a shorter wavelength than the first red dopant and the second red dopant,
wherein the first phosphorescent layer is in contact with the hole transport layer, and the third phosphorescent layer is in contact with in an electron transport layer in the phosphorescent stack.

2. The white organic light-emitting device according to claim 1, wherein:
the first phosphorescent layer comprises an electron transport host; and
each of the second phosphorescent layer and the third phosphorescent layer comprises an electron transport host and a hole transport host.

3. The white organic light-emitting device according to claim 1, wherein:
the phosphorescent stack further comprises a fourth phosphorescent layer between the second phosphorescent layer and the third phosphorescent layer; and
the third phosphorescent layer and the fourth phosphorescent layer emit light having a shorter wavelength than the light emitted from the first phosphorescent layer and the second phosphorescent layer.

4. The white organic light-emitting device according to claim 3, wherein the second phosphorescent layer, the fourth phosphorescent layer, and the third phosphorescent layer sequentially emit shorter-wavelength light.

5. The white organic light-emitting device according to claim 1, wherein the HOMO energy level of the second red dopant is higher than the HOMO energy level of the hole transport layer.

6. The white organic light-emitting device according to claim 1, wherein:
the electron transport host is a compound having a triazine core; and
the hole transport host is a phenylamine compound or a biphenylamine compound.

7. The white organic light-emitting device according to claim 1, wherein:
the first red dopant of the first phosphorescent layer is contained in a concentration equal to or greater than a concentration of the second red dopant of the second phosphorescent layer;

the first red dopant and the second red dopant are contained in an amount of 2 wt % to 9 wt % in the first phosphorescent layer and the second phosphorescent layer, respectively; and the third dopant is contained in an amount of 5 wt % to 19 wt % in the third phosphorescent layer.

8. The white organic light-emitting device according to claim 1, wherein:

the second phosphorescent layer comprises the electron transport host in a larger amount than the hole transport host; and the third phosphorescent layer comprises the hole transport host in a larger amount than the electron transport host.

9. The white organic light-emitting device according to claim 1, wherein the first red dopant is a compound containing a combination of iridium and thieno-pyrimidine.

10. The white organic light-emitting device according to claim 1, wherein the first phosphorescent layer and the second phosphorescent layer comprise the same electron transport host.

11. The white organic light-emitting device according to claim 1, further comprising, between the first electrode and the second electrode, at least one first blue emission stack between the first electrode and the phosphorescent stack, and at least one second blue emission stack between the phosphorescent stack and the second electrode, wherein each of the first blue emission stack and the second blue emission stack comprises a blue fluorescent layer.

12. The white organic light-emitting device according to claim 1, further comprising, between the first electrode and the second electrode, at least one blue emission stack between the first electrode and the phosphorescent stack or between the phosphorescent stack and the second electrode, wherein the blue emission stack comprises a blue fluorescent layer.

13. The white organic light-emitting device according to claim 1, wherein:

the first phosphorescent layer and the second phosphorescent layer each have a luminescence peak at a wavelength of 600 nm to 640 nm; and the third phosphorescent layer has a luminescence peak at a wavelength of 500 nm to 540 nm.

14. The white organic light-emitting device according to claim 1, wherein:

the first phosphorescent layer and the second phosphorescent layer each have a luminescence peak at a wavelength of 600 nm to 640 nm; and the third phosphorescent layer has a luminescence peak at a wavelength of 540 nm to 580 nm.

15. The white organic light-emitting device according to claim 4, wherein;

the first phosphorescent layer and the second phosphorescent layer each have a luminescence peak at a wavelength of 600 nm to 640 nm;

the third phosphorescent layer has a luminescence peak at a wavelength of 540 nm to 580 nm; and the fourth phosphorescent layer has a luminescence peak at a wavelength of 500 nm to 540 nm.

16. A display device comprising:

a substrate having a thin film transistor in each of a plurality of sub-pixels;

a first electrode connected to the thin film transistor in the plurality of sub-pixels, and a second electrode spaced apart from the first electrode and provided across the plurality of sub-pixels; and a plurality of emission stacks, separated from each other by charge generation layers interposed therebetween, the plurality of emission stacks between the first electrode and the second electrode, wherein:

at least one of the plurality of emission stacks is a phosphorescent stack;

the phosphorescent stack comprises a hole transport layer, and a first phosphorescent layer on the hole transport layer, a second phosphorescent layer on the first phosphorescent layer, and a third phosphorescent layer on the second phosphorescent layer, each to emit light having a longer wavelength than blue light;

the first phosphorescent layer comprises a first red dopant having a highest occupied molecular orbital (HOMO) energy level lower than or equal to a HOMO energy level of the hole transport layer;

the second phosphorescent layer comprises a second red dopant having a HOMO energy level higher than the HOMO energy level of the first red dopant; and the third phosphorescent layer comprises a third dopant having a luminescence peak at a shorter wavelength than the first red dopant and the second red dopant, wherein the first phosphorescent layer is in contact with the hole transport layer, and the third phosphorescent layer is in contact with in an electron transport layer in the phosphorescent stack.

17. The display device according to claim 16, wherein:

the first phosphorescent layer comprises an electron transport host; and each of the second phosphorescent layer and the third phosphorescent layer comprises an electron transport host and a hole transport host.

18. The display device according to claim 16, further comprising color filters, individually provided in the plurality of sub-pixels, beneath the first electrode or above the second electrode, so that each of the color filters transmits light having passed through the first electrode or the second electrode to emit a different color of light from sub-pixels adjacent to the color filter.

19. The display device according to claim 16, wherein:

the phosphorescent stack further comprises a fourth phosphorescent layer on the third phosphorescent layer; and the third phosphorescent layer and the fourth phosphorescent layer emit light having a shorter wavelength than the light emitted from the first phosphorescent layer and the second phosphorescent layer.

20. The display device according to claim 16, wherein the HOMO energy level of the second red dopant is higher than the HOMO energy level of the hole transport layer.

* * * * *